United States Patent
Yamane

(10) Patent No.: US 7,574,684 B2
(45) Date of Patent: Aug. 11, 2009

(54) DESIGN DATA CREATING METHOD, DESIGN DATA CREATING APPARATUS AND COMPUTER READABLE INFORMATION RECORDING MEDIUM

(75) Inventor: Atsushi Yamane, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 16 days.

(21) Appl. No.: 11/583,775

(22) Filed: Oct. 20, 2006

(65) Prior Publication Data

US 2007/0300199 A1    Dec. 27, 2007

(30) Foreign Application Priority Data

Jun. 27, 2006    (JP) .............................. 2006-177264

(51) Int. Cl.
*G06F 17/50* (2006.01)

(52) U.S. Cl. ................................. 716/11; 716/3; 703/15

(58) Field of Classification Search ................... 716/11, 716/3; 703/15
See application file for complete search history.

(56) References Cited

U.S. PATENT DOCUMENTS

| | | | |
|---|---|---|---|
| 6,026,228 A * | 2/2000 | Imai et al. .................... 716/18 |
| 6,470,482 B1 * | 10/2002 | Rostoker et al. ............... 716/6 |
| 6,904,392 B1 | 6/2005 | Marty et al. |
| 6,917,909 B1 * | 7/2005 | Markov et al. ................. 703/14 |
| 7,039,875 B2 * | 5/2006 | Khalfay et al. .............. 715/762 |
| 2003/0145300 A1 | 7/2003 | Tran |

FOREIGN PATENT DOCUMENTS

| | | |
|---|---|---|
| EP | 0 463 301 | 1/1992 |
| JP | 7-93013 | 4/1995 |
| JP | 11-353350 | 12/1999 |
| JP | 2002-157285 | 5/2002 |
| WO | WO 02/01424 | 1/2002 |

OTHER PUBLICATIONS

Ibrahim et al., "Solving the Spaghetti Plate Syndrome in a Control-Flow Language With a VLSI-Like Solution", Proceedings of 1999 IEEE Symposium on Visual Languages, Sep. 13-16, 1999, pp. 202-203.*

Extended European Search Report, mailed Mar. 26, 2007, and issued in corresponding European Patent Application No. 06121826.9-2224.

* cited by examiner

*Primary Examiner*—Phallaka Kik
(74) *Attorney, Agent, or Firm*—Fujitsu Patent Center

(57) ABSTRACT

A design data creating method, for creating design data to which predetermined design constraint requirements are added, includes a display data converting step of converting input design constraint requirements into display data for displaying on a design drawing displayed on a display device; and a control data converting step of converting input design constraint requirements into control data for controlling a CPU.

15 Claims, 19 Drawing Sheets

FIG.2 RELATED ART

| ARTWORK DESIGN SPECIFICATION AND REQUEST (3/) | ARTWORK SPECIFICATION | NO. XXXXXXX |
|---|---|---|

PLACEMENT AND ROUTING REQUIREMENTS

※THE FOLLOWING REQUIREMENTS ARE THE SAME AS XXX
CHANGED POINTS BY THE REVISION ARE SPECIFIED FROM THE ITEM 5.

1. PLACEMENT AND ROUTING REQUIREMENTS:
 (1) FOR PART MOUNTING HEIGHT REQUIREMENTS AND POSITION DESIGNATED PARTS, SEE SUBSTRATE DRAWING XXX.
 (2) FOR PLACEMENT OF PARTS, SEE PART PLACEMENT DRAWING XXX. DEPENDING ON PATTERNED ROUTING, MOVE PARTS SLIGHTLY IF NECESSARY.
 (3) FOR PARTS HAVING INDICATION OF 'MOUNTING NEAR' OR 'SHORTEST', MAKE PLACEMENT FOR THE SHORTEST ALSO IN CONSIDERATION OF THE PIN NOS.
 (4) PLACE BYPASS CAPACITOR OF IC NEAR POWER SOURCE PIN OF IC DESIGNED BY SCHEMATIC DIAGRAM.
 (5) PLACE CAPACITORS OF C003, C006, C163, C198, C206 AND C207 NEAR M002.
 KEEP SHORTEST ROUTING AND ALSO PROVIDE EARTH GUARD FOR PATTERN XXX, SEE SCHEMATIC DIAGRAM PAGE 002. MOUNT XXX NEAR M002. DO NOT PLACE PATTERN IN LAYER UNDER M002.
 REGARD L2 AS GND1
 (6) MOUNT C002, C215 IN SHORTEST. PROVIDE EARTH GUARD FOR MMCLX AND TRST NRSET.
 SET XXX NEAR M001 IN CONTACTABLE POSITION.
 PAD SIZE IS 0.75□, AND MAKE SILK PRINTING.
 (7) FOR CIRCUIT XXX, MAKE WIRING ENCLOSED BY DASHED LINE OF CIRCUIT DRAWING, WITHIN 50mm IN EQUAL LENGTH WITH IMPEDANCE 50Ω. AND PLACE C210, FL02, FL03, D1S-D21, C208 AND C209 NEAR USB TERMIAL AS MUCH AS POSSIBLE.
 ALSO, PROVIDE EARTH GUARD AND GND BETWEEN LAYERS. MOUNT RESISTORS AND CAPACITORS OF THIS PAGE NEAREST TO XXX, AND CONNECT ON MOUNTING SURFACE OF CONNECTOR. SEE SCHEMATIC DIAGRAM 004.

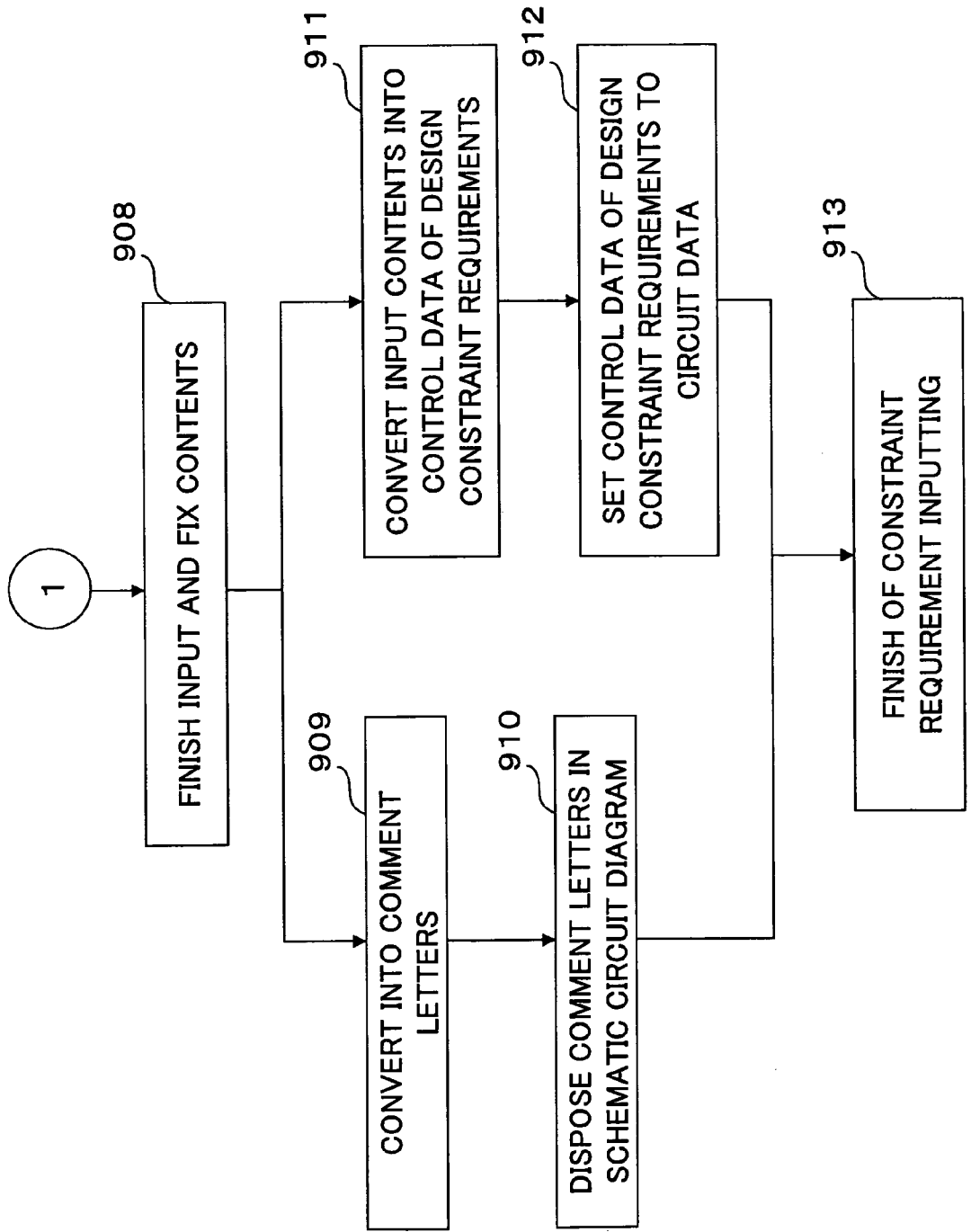

FIG.14

| No | ITEM | EXPLANATION |
|---|---|---|
| 1 | CHECK INPUT LETTER TYPE | CHECK WHETHER OR NOT LETTER TYPE IS PROPER. FOR EXAMPLE, INPUT OF ALPHABET OR SYMBOL IN SPACE FOR NUMERICAL VALUE CORRESPONDS TO ERROR. |
| 2 | CHECK FOR LACK | CHECK WHETHER INPUT CONTENTS ARE SUFFICIENT. CHECK WHETHER LACK IN NECESSARY ITEMS FOR SETTING CONSTRAINT REQUIREMENTS OCCURS. |
| 3 | CHECK NUMERICAL VALUE | CHECK WHETHER INPUT NUMERICAL VALUE SHOWS PROPER RANGE. FOR EXAMPLE, FOR INDICATING LINE LENGTH, IT SHOULD BE POSITIVE. |

DESIGN DATA CREATING METHOD, DESIGN DATA CREATING APPARATUS AND COMPUTER READABLE INFORMATION RECORDING MEDIUM

BACKGROUND OF THE INVENTION

1. Field of the Invention

The present invention relates to a design data creating method, a design data creating apparatus and a computer readable information recording medium.

2. Description of the Related Art

For example, as means for designing electronic circuits, an electronic circuit design CAD apparatus (simply referred to as a circuit design CAD, hereinafter) exists for designing an electronic circuit such as a printed circuit substrate (i.e., PCB).

An operation speed of a device used in an electronic circuit has been increased along with a progress of the related technology. In a recent electronic circuit, since many devices of increased operation speeds are used, such a design as that considering countermeasures for electronic noise is required. In order to proceed with a design considering countermeasures for electronic noise with the use of the above-mentioned circuit design CAD, a circuit designer may give 'design constraint requirements' to a packaging designer, in any one of the following two methods (1) and (2), in the related art.

It is noted that, the above-mentioned design constraint requirements mean constraint requirements required for carrying out a packaging design considering electric noise, for example. Specifically, constraint requirements concerning a wiring width, a wiring length, a wiring route or such, may be included, for example.

(1) The circuit designer creates a packaging design instruction sheet, and gives it to the packaging designer.

In this method, as shown in FIG. 1, the circuit designer creates the packaging design instruction sheet as a separate document from data created by means of the circuit design CAD (i.e., EDIF data, described later, or such), and manages the same. In this method, the design constraint requirements are shown only on a paper sheet of the packaging design instruction sheet as shown in FIG. 2, and the packaging designer carries out a packaging design with reference to this packaging design instruction sheet.

(2) The design constraint requirements are described in a schematic circuit diagram itself, in a form of comments.

In this method, as shown in FIG. 3, the circuit designer manually writes the design constraint requirements in the schematic circuit diagram itself in the form of comments, other than the above-mentioned packaging design instruction sheet. As a result, the packaging designer can easily recognize the constraint requirements when referring to the schematic circuit diagram itself. The packaging designer refers to the above-mentioned packaging design instruction sheet and the design constraint requirements written in the schematic circuit diagram in the form of comments, and carries out a packaging design according to thereto. Furthermore, the circuit designer himself or herself can use the design constraint requirements directly written in the schematic circuit diagram in the form of comments, for checking after the packaging designer has completed the packaging design.

In the method (1), the above-mentioned packaging design instruction sheet is handled separately from data, handled by the circuit design CAD or the packaging design CAD, and is created by means of word-processor software or such. The packaging designer prints out the packing design instruction sheet by means of a printer, to confirm the contents thereof, or, causes the contents thereof to be displayed on a monitor of a personal computer by means of software, different from the software of the circuit design CAD itself or the packaging design CAD itself. That is, there is no linkage given with the CAD software.

In the method (2), as shown in FIG. 3, since the work of writing the design constraint requirements in the schematic circuit diagram in the form of comments is made manually, man hours are required accordingly. The comments thus written in the schematic circuit diagram are ordinary comment data, and thus, also no linkage is given with such a type of design constraint requirements which are set in CAD data such as EDIF data for the purpose of DRC described below.

That is, the design constraint requirements written in the form of comments are managed separately. Accordingly, for a case where the same design constraint requirements should be set uniformly in each of many similar circuits, the same comments should be written in each of these similar circuits separately. In this case, for when the thus-given design constraint requirements are modified after that for example, all the corresponding comments should be modified separately in the same manner one by one. As a result, man hours are required, and also, a possibility of human error should be considered.

Japanese Laid-open Patent Applications Nos. 2002-157285, 11-353350 and 7-93013 disclose related arts.

SUMMARY OF THE INVENTION

The present invention has been devised in consideration of the above-mentioned situations, and an object of the present invention is to provide a system by which, as design constraint requirements required for carrying out a design of an electronic circuit or such, two different types of design constraint requirements, i.e., a first type of the design constraint requirements as instructions for controlling a design tool such as a DRC described later, and a second type of the design constraint requirements as display data for a designer (i.e., user) to visually recognize the contents, are automatically generated.

In order to achieve the object, according to the present invention, when a designer carries out operation to write design constraint requirements in a design drawing displayed on a display device, the design constraint requirements thus written are displayed in the design drawing as display data, and also, the same is automatically converted into control data which controls a CPU.

As a result, the designer should merely carry out operation to write design constraint requirements to the design drawing, whereby the control data of the design constraint requirements which is used for controlling a design tool such as a DRC, is automatically generated. Accordingly, man hours of the designer can be positively reduced.

Thus, according to the present invention, design constraint requirements required for a design are obtained in a form of display data (i.e., the above-mentioned second type) which a designer can visually recognize, and also, the design constraint requirements are obtained in a form of control data (i.e., the above-mentioned first type) which is used for controlling a design tool such as a DRC. Accordingly, not only man hours of the designer can be positively reduced, but also, a possibility of human error otherwise occurring when the respective data were manually input separately, can be effectively reduced.

BRIEF DESCRIPTION OF THE DRAWINGS

Other objects and further features of the present invention will become more apparent from the following detailed description when read in conjunction with the accompanying drawings:

FIGS. 1 and 2 illustrate an electronic circuit. design procedure in one example in the related art;

FIGS. 12 and 13 show a flow chart of a procedure of inputting design constraint requirements in the schematic circuit diagram in the circuit design CAD in the embodiment of the present invention;

FIG. 14 shows check items for checking input contents carried out when the design constraint requirements are input in the schematic circuit diagram in the circuit design CAD in the embodiment of the present invention;

DETAILED DESCRIPTION OF THE PREFERRED EMBODIMENTS

Embodiments of the present invention will now be described with reference to figures.

Figure 4:
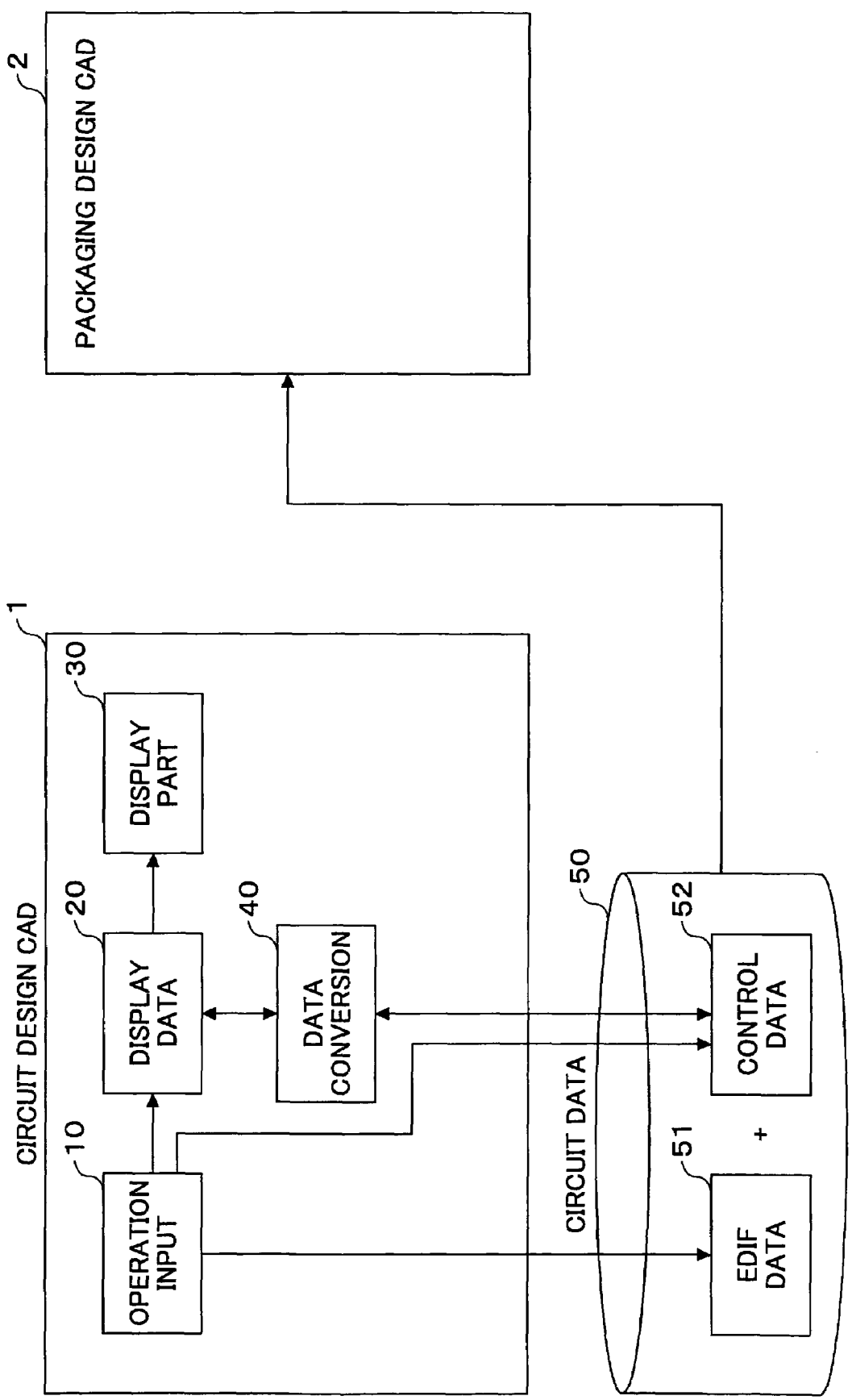
FIG. 4 shows a functional block diagram illustrating a principle configuration of a circuit design CAD in one embodiment of the present invention.

FIG. 4 shows a block diagram illustrating a principle configuration of a design data creating method and a design data creating apparatus in one embodiment of the present invention.

A circuit design CAD 1 shown in FIG. 4 is a CAD (computer aided design or computer aided drafting) apparatus having a function to aid design work of a circuit designer for designing an electronic circuit.

The circuit designer designs an electronic circuit on the circuit design CAD 1 shown in FIG. 4, and transfers the thus-obtained design data 51 in a form of an EDIF (electronic design interchange format), to a packaging design CAD 2 prepared for a printed substrate packaging design work. Based on the thus-referred design data 51, the packaging designer carries out packaging design for the electronic circuit.

It is noted that, the circuit designer sets the above-mentioned design constraint requirements, which the packaging design of the electronic circuit should follow, and transfers them, as control data 52 which is used for controlling a CPU of the packaging design CAD 2, to the packaging design CAD 2 together with the above-mentioned EDIF data 51. Data including the design data 51 in the form of EDIF data and the control data 52 for controlling the CPU of the packaging design CAD 2, is referred to as circuit data 50, which is thus transferred from the circuit design CAD 1 to the packaging design CAD 2.

The packaging design CAD 2 carries out, in the packaging design of the electronic circuit, DRC (design rule check) processing and so forth, according to the control data 52 of the design constraint requirements. Thus, the packaging design CAD 2 is controlled in such a manner that the packaging design satisfying the design constraint requirements may be achieved. That is, the packaging designer is constrained to carry out the packaging design in such a manner that, finally, the packaging design satisfying the design constraint requirements may be achieved, by the functions of the DRC of the packaging design CAD 2. As a result, it is possible that the packaging design of the electronic circuit satisfying the design constraint requirements can be easily achieved.

The circuit design CAD 1 includes an operation input part 10 for the circuit designer to input operation instructions, a display part 30 having a display screen for displaying an schematic circuit diagram or such, and a data converting part 40 for converting display data 20 for displaying on the display part 30 into the above-mentioned control data 52 of the design constraint requirements.

It is noted that, in FIG. 4, parts directly relating to the present invention, i.e., parts concerning processing of design constraint requirements are shown selectively, and other parts, i.e., functional parts concerning actual electronic circuit design work and so forth, which are provided in a common CAD apparatus, are omitted.

Figure 1:
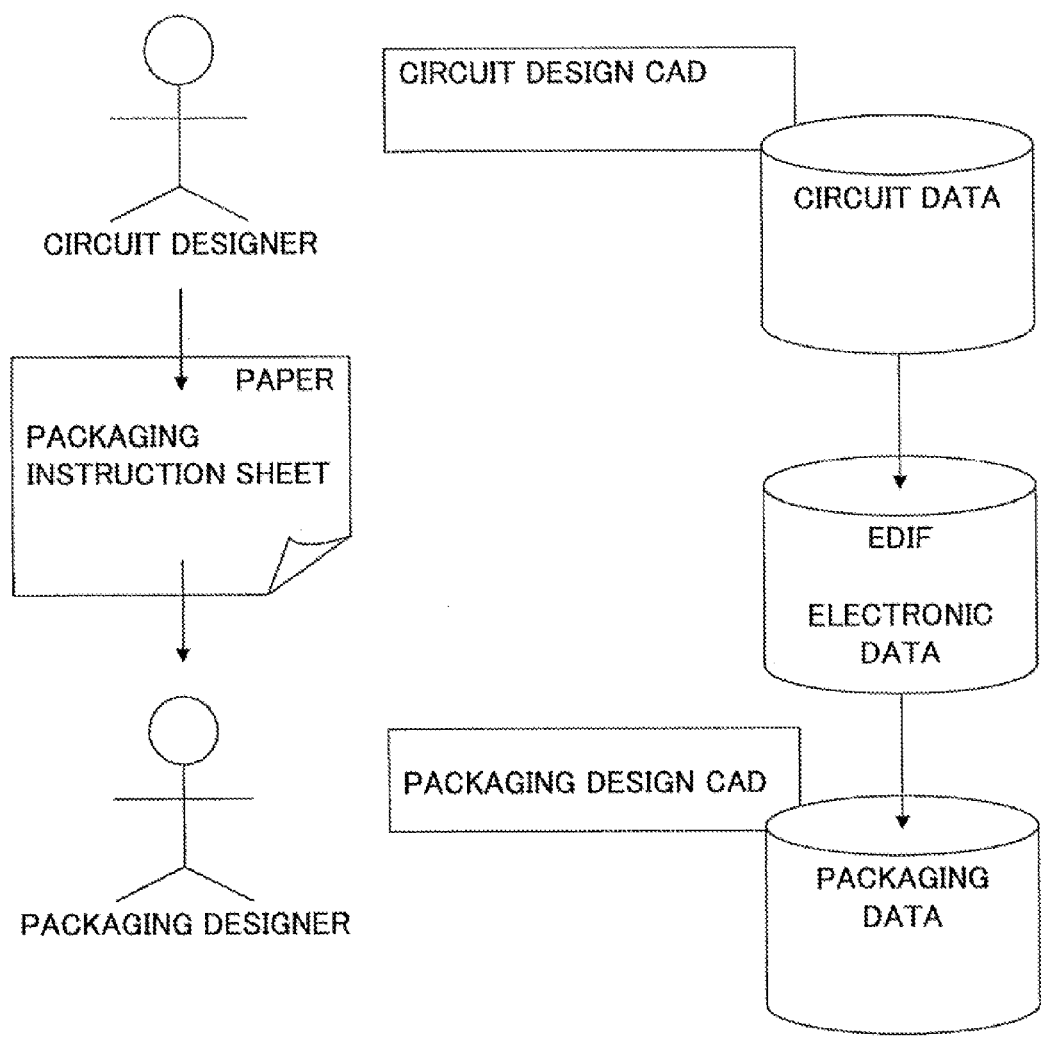
Figure 3:
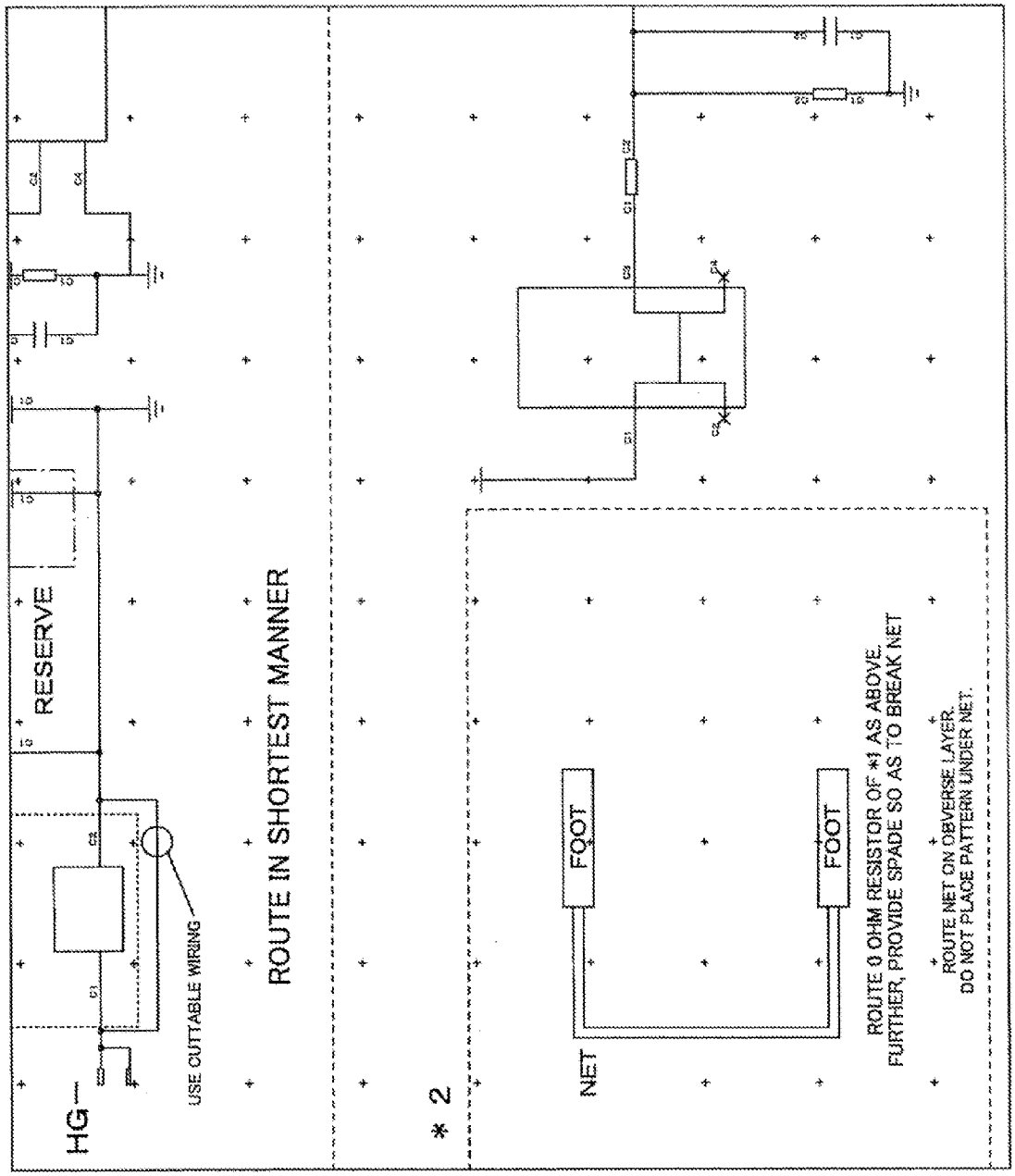
FIG. 3 illustrates an electronic circuit design procedure in another example of the related art.

According to the embodiment of the present invention, the circuit designer carries out circuit design for an electronic circuit with reference to the display part 30, and, sets design constraint requirements if necessary. Specifically, as shown in FIG. 3, the circuit designer writes the design constraint requirements in a form of comments or such, in the schematic circuit diagram displayed on the display device 30. As a document creating application program applied when thus writing the design constraint requirements in the form of comments or such, one which is well-known in the art of CAD may be applied, and should not be limited to a specific one.

The data converting part 40 converts display data 20 of the design constraint requirements in the form of comments or such, thus created with the use of the document creating application program, into control data 52 which is used for controlling the CPU of the packaging design CAD 2. As a result, the circuit designer can become free from separately creating the control data of the design constraint recruitments for controlling the CPU of the packaging design CAD 2, in addition to writing of the design constraint requirements in the form of comments or such in the schematic circuit diagram. Thus, circuit design work can be improved in terms of the efficiency.

Further, the data converting part 40 also has a function of converting control data 52 of design constraint requirements, which is existing one or one the circuit designer has directly created, into display data 20 for displaying in the corresponding schematic circuit diagram in a manner as shown in FIG. 3 on the display part 30, of the corresponding design constraint requirements in the form of comments or such.

As a result, the circuit designer can become free from manually creating the corresponding display data 20 in the form of comments or such, separately, other than the control data 52 of the design constraint requirements, which is the existing one or the one the circuit designer has directly created.

It is noted that, the data converting part 40 may further have a function of, as shown in FIG. 2, creating a document in a form of the packaging design instruction sheet such as that shown in FIG. 2, for being printed out in a from of a paper document. As a result, it is possible to manage information of the design constraint requirements in various forms, and thus, it is possible to provide variety in a management work for electronic circuit design information.

Further, according to the embodiment of the present invention, thanks to the functions of the data converting part 40, it is possible to include, into circuit data 50 in the circuit design CAD 1 in a form of electronic data, the contents of design constraint requirements written in a packaging design instruction sheet, which is previously separately created with the use of a function of the document creating application program such as a word processor. As a result, the thus-input contents can be managed, in a shared manner, between the circuit design CAD 1 and the packaging design CAD 2, so that the contents can be handled by both, as control data 52.

Further, the control data 52 may be managed between the circuit design CAD 1 and the packaging design CAD 2 in a shared manner, also in the form of display data 20. In this case, the display data 20 is data according to a format which is one commonly applicable to both of the circuit design CAD 1 and the packaging design CAD 2, and is one, which can be output in a form of design constraint requirement card.

Thereby, the design constraint requirements can be managed by both the circuit design CAD 1 and the packaging design CAD 2 in the shared manner. Further, the designer can be free from managing the same in a separate document which is one, created with the use of the document creating application program such as a word processor. As a result, human error in the management can be eliminated.

When the circuit designer carries out operation to give design constraint requirements in a form of comment letters or figures (simply referred to as 'in a form of comments or such') in a schematic circuit diagram displayed on the display part 30, the thus-input contents of the design constraint requirements are automatically converted into corresponding control data 52, thanks to the functions of the data converting part 40, and are set in circuit data 50 together with the above-mentioned EDIF data 51. Further, when the circuit designer thus inputs the design constraint requirements in the form of comments or such, a linkage with the control data 52 of the same design constraint requirements set in the circuit data 50, can be automatically given.

Further, a configuration may be provided such that, for a case where common design constraint requirements, which are once given to each of a plurality of similar electronic circuits, should be modified, when a requirement set to one of the plurality of electronic circuits is modified by the designer, corresponding requirements set to the other circuits can be automatically modified accordingly. Thereby, the designer can be free from manually modifying each of all of the design constraint requirements in the form of comments or such, and thus, human error such as modification omission, modification error or such, can be eliminated.

For the purpose that the data converting part 40 can function as described above, the data converting part 40 should have the following functions. It is assumed that, here, a plurality of electronic circuits will be designed, similar to a first electronic circuit, for which, as circuit data 50, EDIF data 51 and control data 52 are previously stored. In this case, a circuit designer first displays the stored circuit data 50 on the display part 30. At this time, thanks to the functions of the data converting part 40, corresponding display data 20 is automatically created. Based thereon, as shown in FIG. 3, the design constraint requirements are displayed in the form of comments or such (i.e., the display data 20), in the schematic circuit diagram on the display part 30.

The circuit designer then makes operation (described later with reference to FIGS. 18 and 19) to copy the design constraint requirements thus displayed, corresponding to the data previously stored as mentioned above for the first electronic circuit, for the above-mentioned newly designing plurality of similar electronic circuits. As a result, data the same as the display data 20 of the design constraint requirements is automatically generated, i.e., copied, and, based thereon, the design constraint requirements in the form of comments or such having the same contents are displayed also in each of the newly designing plurality of similar electronic circuits. At this time, thanks to the functions of the data converting part 40, also control data 52 corresponding to each of the thus-created display data 20 for the newly designing electronic circuits is automatically created and is stored automatically, in such a manner that, the control data 52 has a linkage with the corresponding EDIF data of each of these newly designing similar electronic circuits, as a part of the corresponding circuit data 50 of each of these newly designing similar electronic circuits. As a result, the circuit designer should merely carry out the operation to copy the display data 20 of the design constraint requirements in the form of comments or such, displayed for the first electronic circuit, whereby, also for each of the newly designing similar electronic circuits, the corresponding control data 52 is automatically copied, and is stored with the linkage to the corresponding EDIF data of the newly designing similar electronic circuits, respectively.

Further, the circuit designer may create display data 20 in the form of comments or such, automatically from the control data 52 of the design constraint requirements, data of which is previously input by means of a design constraint requirement editor or such separately, thanks to the functions of the data converting part 40, and then, may give the display data 20 to the schematic circuit diagram displayed on the display part 30. Thereby, the circuit designer can be free from manually inputting such comments in the schematic circuit diagram as in the related art, and thus, human error such as omission of inputting, erroneous inputting or such, may be eliminated.

In this case, when the circuit designer directly creates control data 52 of design constraint requirements with the use of the above-mentioned design constraint requirement editor, the data converting part 40 automatically converts the control data 52 into corresponding display data 20. As a result, thanks to well-known CAD functions, the design constraint requirements in the form of comments or such are automatically displayed in the schematic circuit diagram previously displayed on the display part 30.

In the above description, storage of the circuit data 50 is carried out in such a manner that the circuit data 50 is made of the EDIF data and the control data 52. However, this configuration should not be limited to. It is also possible that storage is made in such a manner that, both the circuit design itself (corresponding to the EDIF data) and the design constraint requirements are stored with a linkage given therebetween, in a form of display data 20 for displaying on the screen of the display part 30 or for printing out into a paper document. In this case, the design constraint requirements are stored in the form of display data 20, and, for the purpose of applying this information to the above-mentioned DRC or such in the packaging design CAD 2, first the data converting part 40 should convert the design constraint requirements in the display data 20 into those in the form of control data 52.

Further, it is noted that the embodiment of the present invention can be realized in a form of electronic circuit designing software. That is, the electronic circuit designing software is installed in a computer, which is thus made to function as a CAD apparatus, and as a result, a circuit designer can select figures representing electronic parts or signal lines and also give design constraint requirements thanks to the functions of the CAD apparatus. Thus, electronic circuit design work is aided by the software.

That is, a program for causing a CPU of a computer to execute the above-described and later-described functions of the data converting part 40 and so forth is prepared, the program is then executed by the CPU, and thus, the functions of the data converting part 40 and so forth, are realized.

At this time, when the circuit designer carries out operation to give design constraint requirements in the form of comments or such directly in a schematic circuit diagram displayed on the display part 30, the functions of the data converting part 40 automatically creates corresponding control data 52 of the same design constraint requirements.

Further, according to the functions of the electronic circuit designing software, the data converting part 40 automatically creates display data in the form of comments or such, from the control data 52 of the design constraint requirements previously set in the circuit data 50, and displays the same in the schematic circuit diagram on the display device 30.

Further, in this case, the CAD functions of the electronic circuit designing software displays the design constraint requirements in the form of comments or such, in the schematic circuit diagram on the display device 30, and the circuit designer may make operation to select one of the thus-displayed items of the design constraint requirements, to change a display size or such.

Further, thanks to the CAD functions of the electronic circuit designing software, a configuration may be provided such that, the display state of the thus-displayed design constraint requirements may be switched between a displaying state and a not displaying state.

Further, thanks to the CAD functions of the electronic circuit designing software, the circuit designer can change the contents of the design constraint requirements after selecting an item thereof from those thus displayed.

Further, thanks to the CAD functions of the electronic circuit designing software, the circuit designer can edit the contents of the design constraint requirements after selecting an item thereof from those thus displayed, whereby the functions of the data converting part 40 automatically update the control data 52 of the design constraint requirements correspondingly.

Further, thanks to the CAD functions of the electronic circuit designing software, a configuration may be preferably provided such that, the display color of the thus-displayed design constraint requirements may be changed after selecting an item thereof from those thus displayed.

Further, it is preferable that the data converting part 40 has a function such that the contents or format of the comment letter information as the display data 20, created from the control data 52 of the design constraint requirements, can be freely edited.

Further, thanks to the CAD functions of the electronic circuit designing software, a configuration may be preferably provided such that, as mentioned above, the circuit designer selects design constraint requirement from those displayed, and copies the same. AS a result, the control data 52 of the design constraint requirements set in the circuit data 50,is automatically copied correspondingly (described later with reference to FIGS. 18 and 19).

Further, according to the embodiment of the present invention, such a function is provided that, the circuit designer may select a part or a signal net from an schematic circuit diagram displayed on the display device 30 of the circuit design CAD 1, may give design constraint requirements thereto, and thus, the thus-set contents are output in a design constraint requirement card which has a common format and thus, sharable with the packaging design CAD 2. Thereby, the circuit designer can be free from manually creating the design constraint requirements as a separate packaging design instruction sheet, and thus, an advantage of transforming the design constraint requirement into electronic data can be effectively provided.

Further, by merely giving design constraint requirements in the form of comments or such to a schematic circuit diagram in the same manner as that of the related art, the contents (i.e., display data 20) are automatically converted into corresponding control data 52, which is then set in circuit data 50 automatically. Thereby, it is possible for the circuit designer to set the control data 52 of the design constraint requirements merely in a feeling of inputting corresponding comments to the schematic circuit diagram.

Further, it is possible that, from previously set control data 52 of design constraint requirements, display data 20 in the form of comments or such is automatically created, and then, is displayed in the schematic circuit diagram. Thereby, the circuit designer is free from manually writing the contents of the design constraint requirements in the form of comments or such in the schematic circuit diagram which is displayed on the display device 30, as long as they are already input and set in the form of control data 52. Further, it is possible to eliminate human error such as omission of writing, or such. Further, by providing a configuration such that the display contents (i.e., display format) can be freely set, user friendliness improves accordingly.

Further, a configuration may be provided such that a set of design constraint requirements in the form of comments or such may be selected from the screen of the CAD apparatus as a lump, whereby the display color the thus-selected set is automatically changed to a selected color. Thus, user friendliness improves accordingly.

Further, by providing a configuration such that, the display size of display data 20 of design constraint requirements in the form of comments or such can be changed, the designer can cause it to be displayed in any size, so that legibility improves accordingly.

Further, by providing a configuration such that switching between the displaying state and the not displaying state of display data 20 of design constraint requirements in the form of comments or such is available, it is possible to print the comments, where unnecessary comments are not displayed. Thus, user friendliness improves accordingly.

Further, by providing a configuration such that display contents of display data 20 are selectively changeable, it is possible to freely modify the display contents in the schematic circuit diagram, the same as for common comment data.

By providing a configuration such that, when display data 20 of design constraint requirements in the form of comments or such is selectively changed on the display screen 30 of the CAD apparatus, the control data 52 of the design constraint requirements held in the circuit data 50 is automatically updated correspondingly, it is possible to integrate two works, i.e., modification of the comments in the schematic circuit drawing and the modification of the control data 52, and thus, man hours can be reduced.

By providing a configuration such that the display color of the display data 20 of design constraint requirements in the form of comments or such on the display screen 30 of the CAD apparatus is selectively changeable, the circuit designer can freely change comments of design constraint requirements which the circuit designer wishes to give an attention, so that the corresponding comments appear conspicuous, or it is possible to print out the same in the same way.

By providing a configuration such that the display data 20 of design constraint requirements in the form of comments or such can be selectively copied on the display screen 30 of the CAD apparatus, the circuit designer is free from inputting the same contents repetitively.

By providing a configuration such that, when the display data 20 of design constraint requirements in the form of comments or such can be selectively copied on the display screen 30 of the CAD apparatus, the control data 52 of the design constraint recruitments set in the circuit data 50 is automatically copied correspondingly, the circuit designer is free from again inputting the control data 52 of the design constraint requirements of the same contents.

Now, the configuration of the embodiment of the present invention will be described more specifically.

Figure 5:
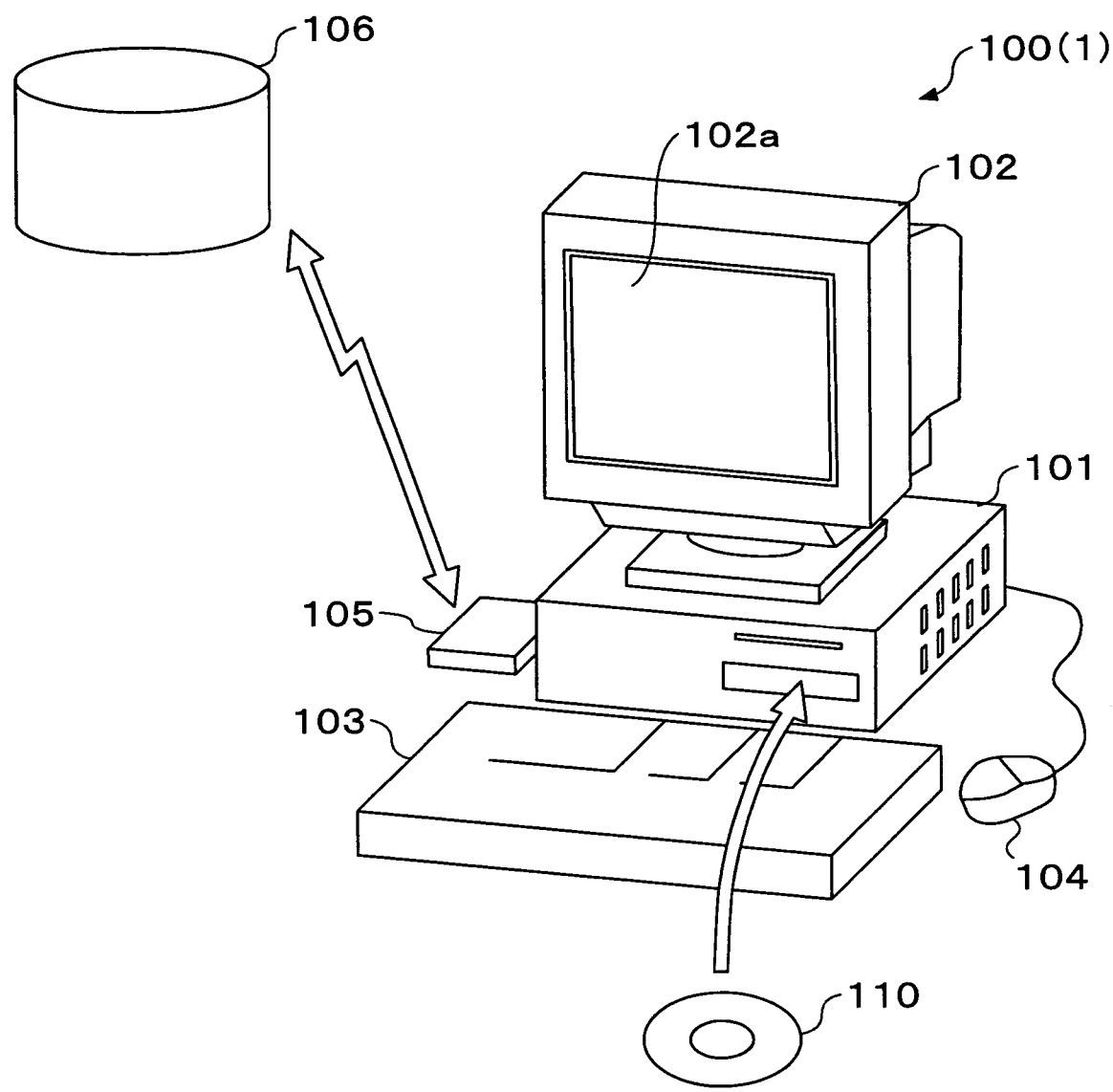
FIG. 5 illustrates a case where the circuit design CAD in the embodiment of the present invention is realized by a computer.

FIG. 5 illustrates a case where the circuit design CAD 1 in the embodiment of the present invention is realized in a form of a computer system in which the above-mentioned electronic circuit designing software is installed.

The computer system 100 shown in FIG. 5 generally includes a body part 101 including a CPU, a disk drive and so forth, a display device 102 displaying an image on a display screen 102*a* according to instructions from the body part 101, a keyboard 103 for inputting various sorts of information to the computer system 100, a mouse 104 for inputting a position on the display screen 102*a*, and a modem 105 for accessing an external database or such to download a computer program or such from another computer system.

The above-mentioned electronic circuit designing software (in a form of a computer program in this case) may be loaded from a portable information storage medium such as a disk 110 (i.e., a CD-ROM or such), or, downloaded from a storage medium 106 of another computer system by means of a communication device such as the modem 105. AS a result, electronic circuit designing functions of CAD are given to the computer system. This program is thus input to the computer system 100 and is compiled there. As a result, the above-mentioned CPU 201, also mentioned later, executes instructions included in the program in sequence, cooperatively with the other functional parts, and thus, realizes the functions of the circuit designing CAD 1 shown in FIG. 4.

One embodiment of the present invention is a computer readable information recording medium storing the above-mentioned electronic circuit designing software program, i.e., the computer readable information recording medium such as the disk 110 storing the above-mentioned computer program, i.e., the electronic circuit designing software program. It is noted that the computer readable information recording medium may not be limited to the portable information recording medium such as a CD-ROM, a DVD-ROM, an IC card memory, a flexible disk, a magneto-optical disk and so forth, and, instead, other various sorts of information recording media, as long as it is accessible by the computer system by means of communication means such as the modem via a communication network, such as the Intent, LAN or such, may be applied in the same way.

Figure 6:
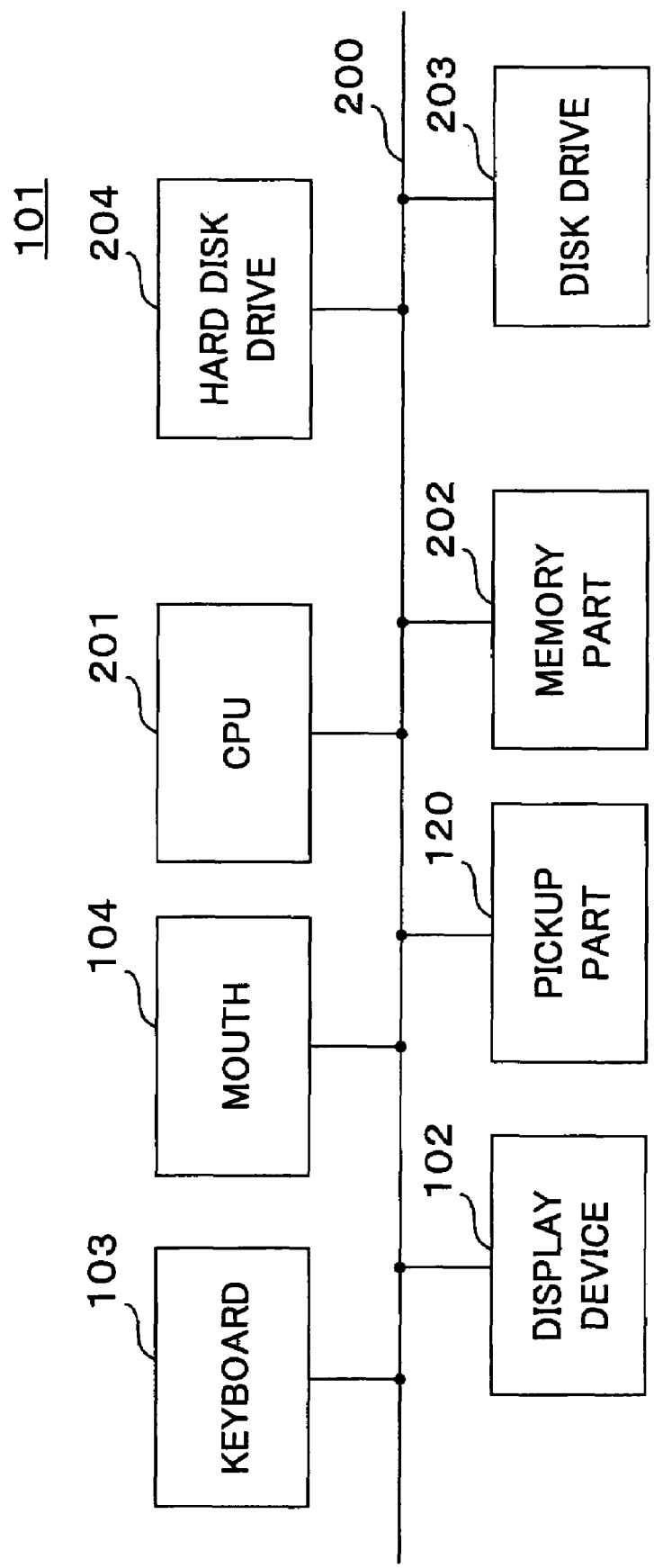
FIG. 6 shows a hardware block diagram of a computer body shown in FIG. 5.

FIG. 6 shows a block diagram generally illustrating the body part 101 of the computer system 100 mentioned above. As shown, the body part 101 includes the CPU 201, a memory part 202 including a RAM, a ROM and so forth, the disk drive 203 for the disk 110 and a hard disk drive (HDD) 204, connected via a bus 200. In the embodiment, also the display device 102, the keyboard 103 and the mouse 104, shown in FIG. 5, are connected to the CPU 201 via the bus 200. However, they may be directly connected to the CPU 201. Further, the display device 102 may be connected to the CPU 201 by means of a well-known graphic interface (not shown) processing input/output of image data. It is noted that the configuration of the computer system 100 is not limited to that shown in FIGS. 5 and 6, and, any other well-known configuration may be applied instead.

Figure 7:
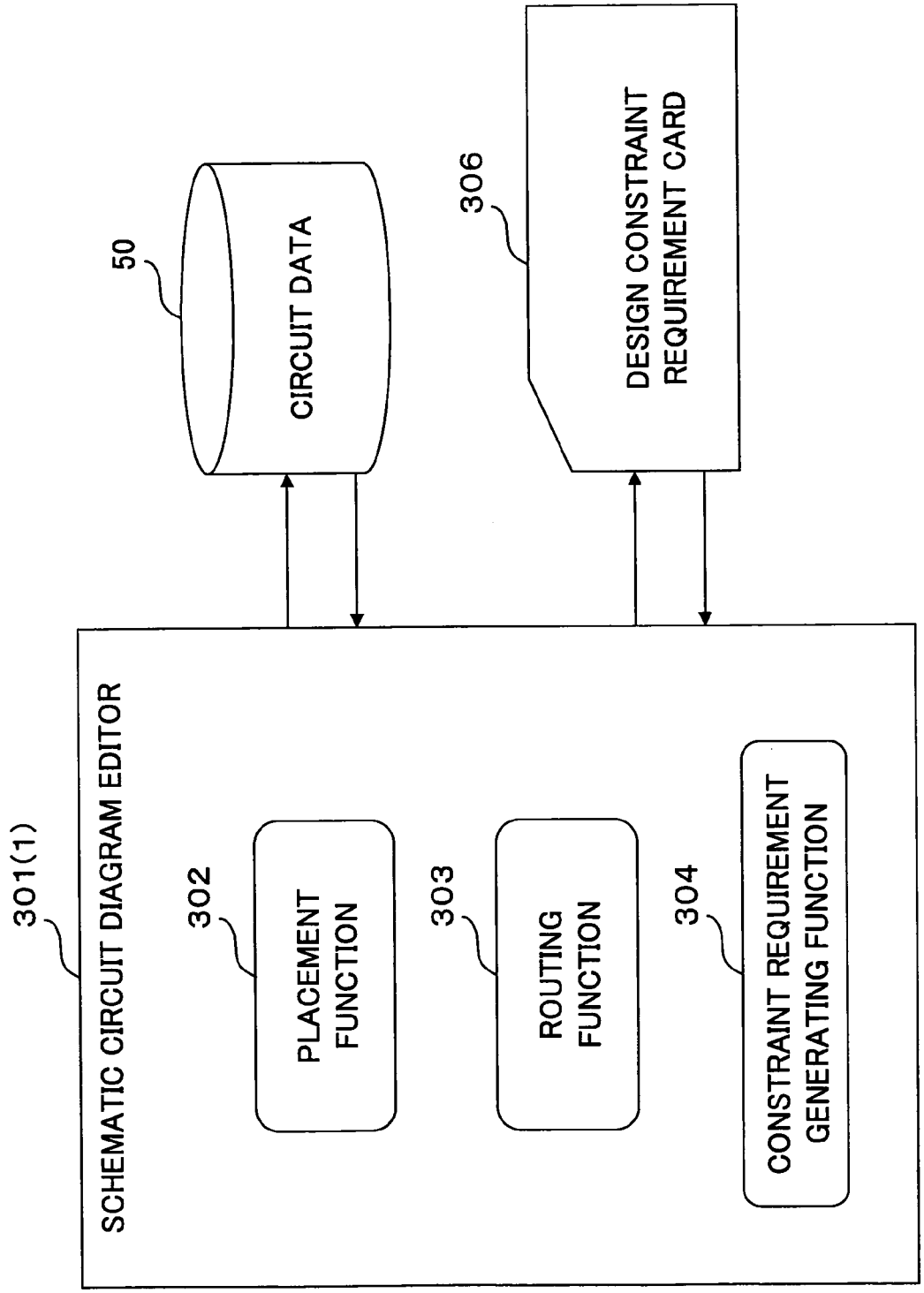
FIG. 7 shows a functional block diagram of the-circuit design CAD in the embodiment of the present invention.

FIG. 7 shows a function block diagram of an electronic circuit designing apparatus 301 (corresponding to the above-mentioned circuit design CAD 1 of FIG. 4). In FIG. 7, the electronic circuit designing apparatus 301 has the function of an schematic circuit diagram editor. The schematic circuit diagram editor has a function 302 of placing symbols representing circuit elements (i.e., electronic parts or such), a function 303 of placing net information representing logical connections between the circuit elements, and a design constraint requirement generating function 304. The electronic circuit designing apparatus 301 has a function of inputting/outputting schematic circuit diagram data 305 (corresponding to the circuit data 50 of FIG. 4). Further, the electronic circuit design apparatus 301 carries out input/output of a design constraint requirement card 306. The design constraint requirement card 306 corresponds to a paper document on which the above-mentioned display data 20 of design constraint requirements is printed out. The functions of the schematic circuit diagram editor include the above-mentioned functions of the data converting part 40.

Figure 8:
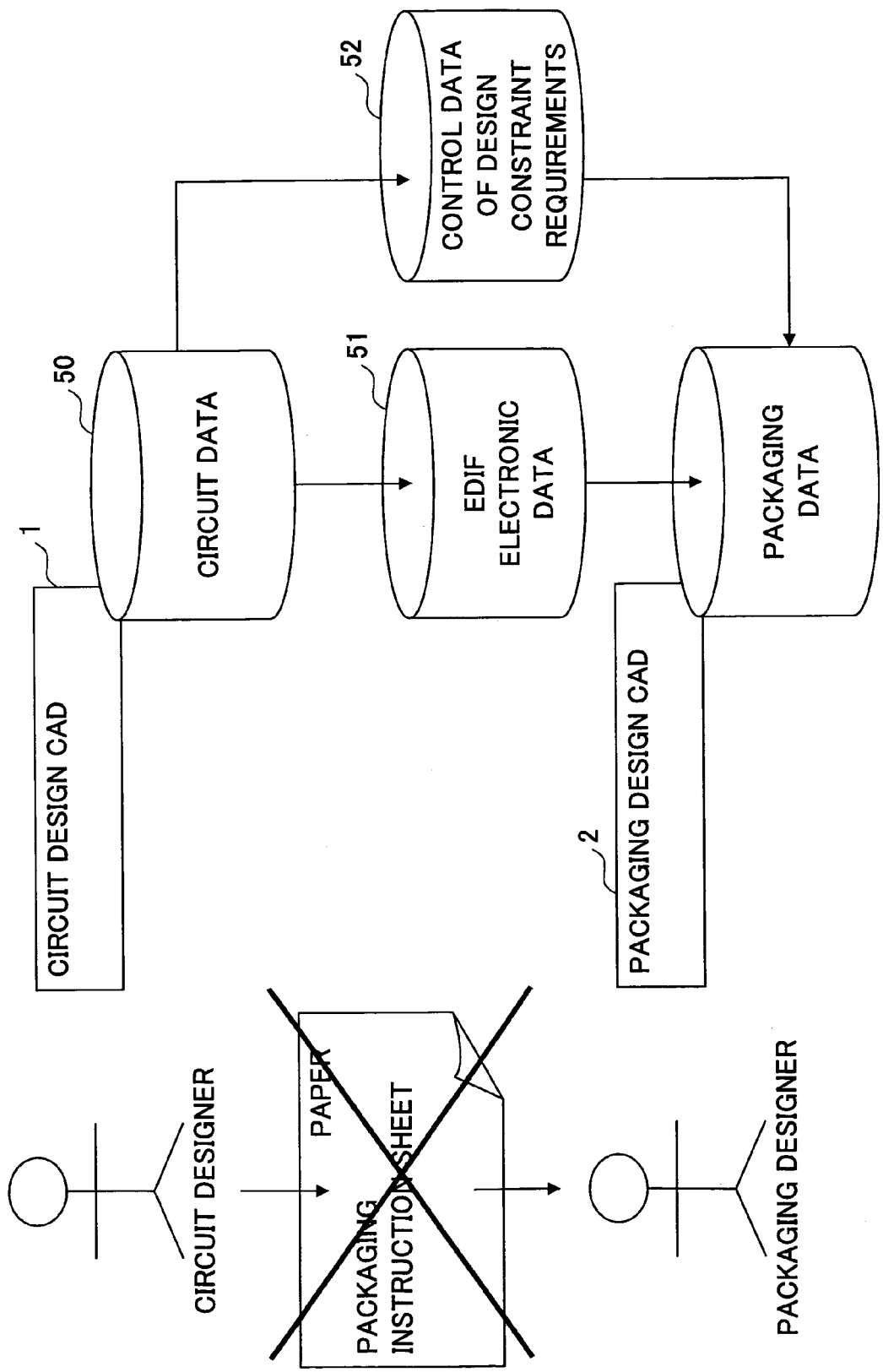
FIGS. 8 and 9 illustrate a data flow in the circuit design CAD in the embodiment of the present invention.

In the embodiment of the present invention, as shown in FIG. 8, the design constraint requirements are exchangeable between the circuit design CAD 1 and the packaging design CAD 2 in a form of electronic data. That is, when the design constraint requirements are set in the circuit design CAD 1 in the form of electronic data, the above-mentioned EDIF (electronic design interchange format) data 51 as a packaging IF (interchange format), and a file of the control data 52 of the design constraint requirements, are output from the circuit designing CAD 1. Then, the packaging design CAD 2 reads the EDIF data 51 and the control data 52 of the design constraint requirements. As a result, a packaging designer is constrained to carry out a design work according to the design constraint requirements, thanks to the DRC functions and so forth, when carrying out packaging design with the use of the packaging design CAD 1 which thus has read the EDIF data 51 and the control data 52 of the design constraint requirements.

Figure 9:
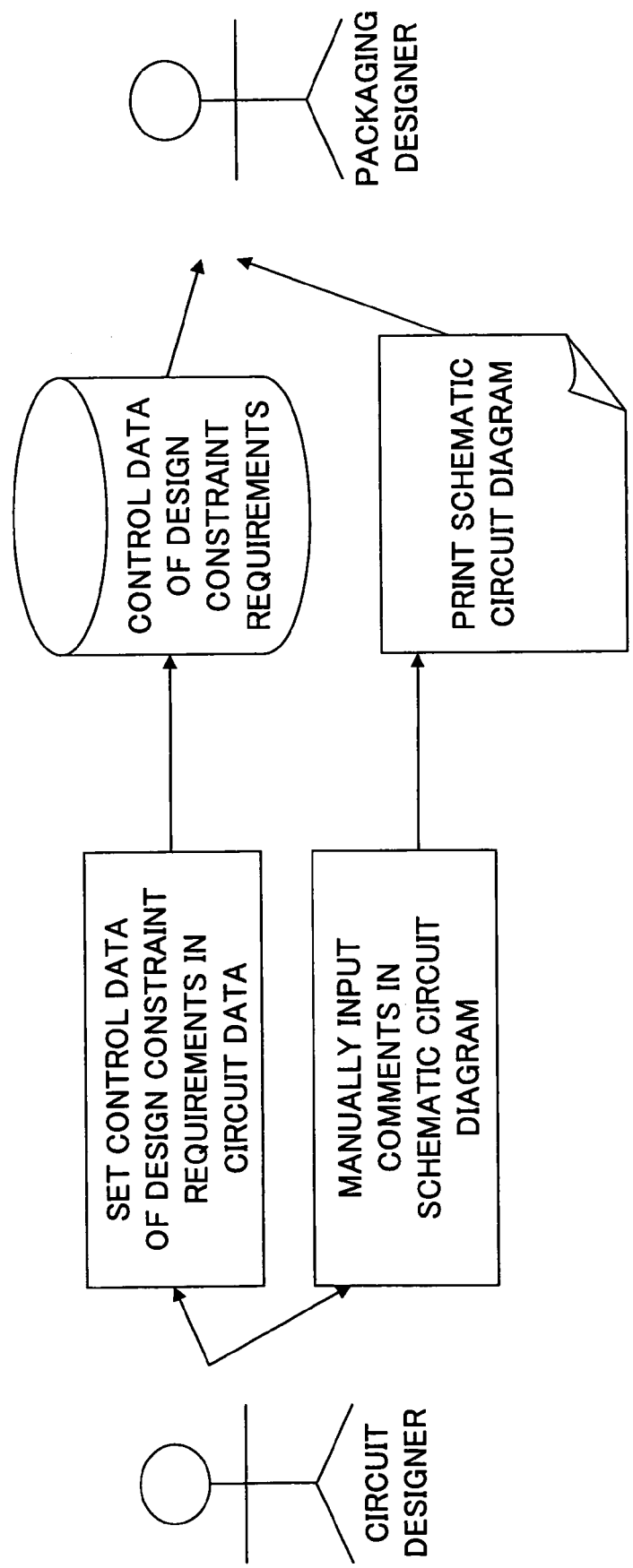

FIG. 9 shows a state in which, in an electronic circuit designing procedure according to the related art, a circuit designer operates a circuit design CAD to set control data of design constraint requirements to circuit data, while manually inputting the design constraint requirements in the form of comments or such to an schematic circuit diagram which is displayed. In this case, the circuit designer creates electronic data of the design constraint requirements, i.e., the control data, and sets the control data to the circuit data with the use of the circuit design CAD. Then, the circuit designer causes a packaging design CAD to read the thus-created electronic data, and the packaging design CAD carries out DRC (design rule check) according thereto. As a result, a design satisfying the design constraint requirements may be achieved. Thus, according to the related art, the circuit designer manually inputs both the control data and the display data of the design constraint requirements.

That is, while actual design work is carried out with the use of the CAD apparatus, there is needs that the designer refers to the schematic circuit diagram on a paper document. In the related art, for this purpose, the circuit designer manually inputs the comment letters to the schematic circuit diagram currently displayed, while setting the control data of the design constraint requirements with the use of the circuit design CAD. As a result, man hours of the circuit designer increases accordingly.

In contrast thereto, according to the embodiment of the present invention, as mentioned above, when a circuit designer directly inputs control data 52 of design constraint requirements to circuit data 50, thanks to the functions of the design constraint requirement editor, display data 20 of the design constant requirements in the form of comments or such can be automatically generated from the control data 52 thanks to the functions of the data converting part 40. As a result, it is possible to automate a work of inputting comment letters to a schematic circuit diagram, which is otherwise carried out manually by the circuit designer in the related art, for the propose of satisfying the above-mentioned needs.

Figure 10:
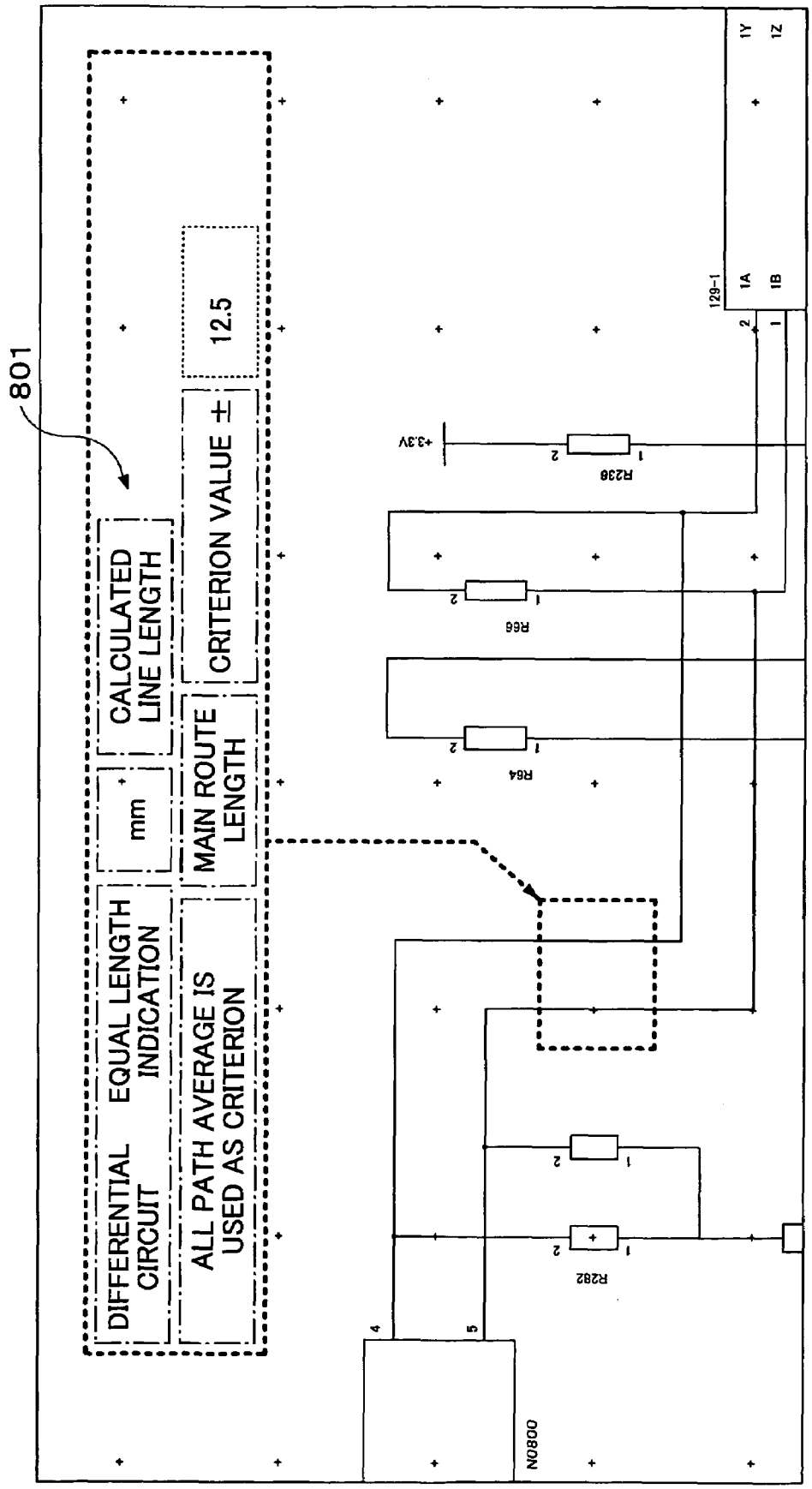
FIG. 10 shows a display example illustrating a procedure of inputting display data of design constraint requirements in an schematic circuit diagram displayed on the circuit design CAD in the embodiment of the present invention.
Figure 11:
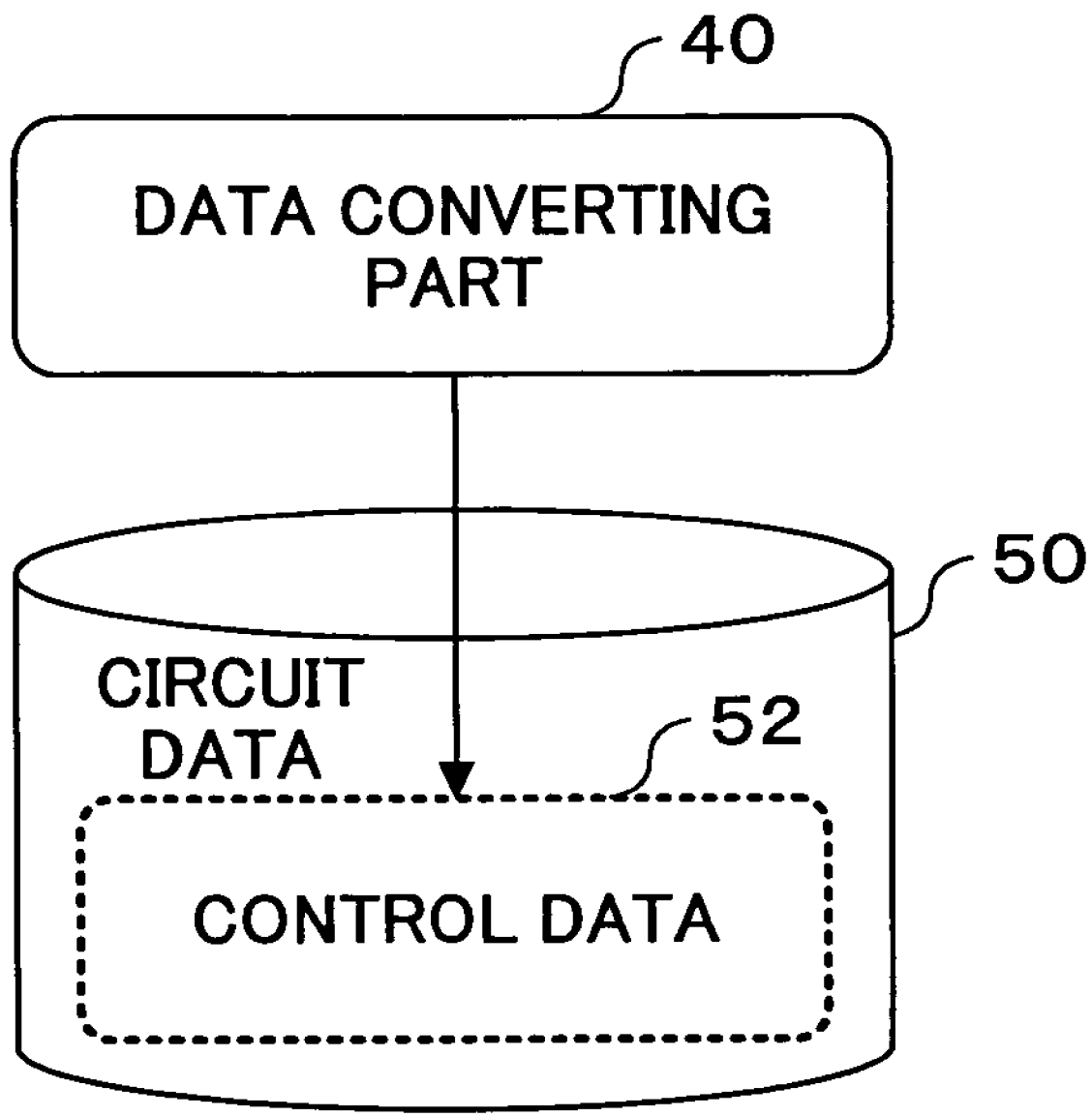
FIG. 11 illustrates processing of converting display data of the design constraint requirements, input in the schematic circuit diagram in the circuit design CAD of the embodiment of the present invention, into control data.

FIGS. 10 and 11 illustrate operation of manually inputting design constraint requirements in the form of comments or such to a schematic circuit diagram displayed on the display part 30 of FIG. 4. As a result of this operation, the data converting part 40 automatically converts these contents into control data 52 of the design constraint requirements, and sets the same in the circuit data 50.

That is, in this case, when the circuit designer carries out operation to write comment letters as the design constraint requirements to the schematic circuit diagram displayed on the display part 30 with the use of the operation input part 10 (see FIG. 4), the data converting part 40 automatically converts the comment letters into the corresponding control data 52 of the design constraint requirements, and automatically sets the same in the circuit data 50.

Specifically, in FIG. 10, a comment inputting space, which is enclosed by a frame (in FIG. 10, the frame of a bold broken line) in the schematic circuit diagram displayed, is displayed. The circuit designer then carries out operation to set comment letters of design constraint requirements in the same manner as that of the related art, in the comment inputting space or the frame. In this case, for the comment letters for which items to set in the frame are previously fixed (i.e., for example, a unit for a numerical value is fixed as mm, μm, ps, ns or such), a corresponding pull-down list is displayed for the user to merely select therefrom. Further, a specific numerical value for indicating a wiring line length for example, the user should manually input to set there.

As a result, as shown in FIG. 11, the comment letters and/or figure information 801, thus given to the schematic circuit diagram displayed, are automatically converted into the corresponding control data 52 of the design constraint requirements, by means of the data converting part 40. And, the same is then input and set in the circuit data 50.

Figure 12:
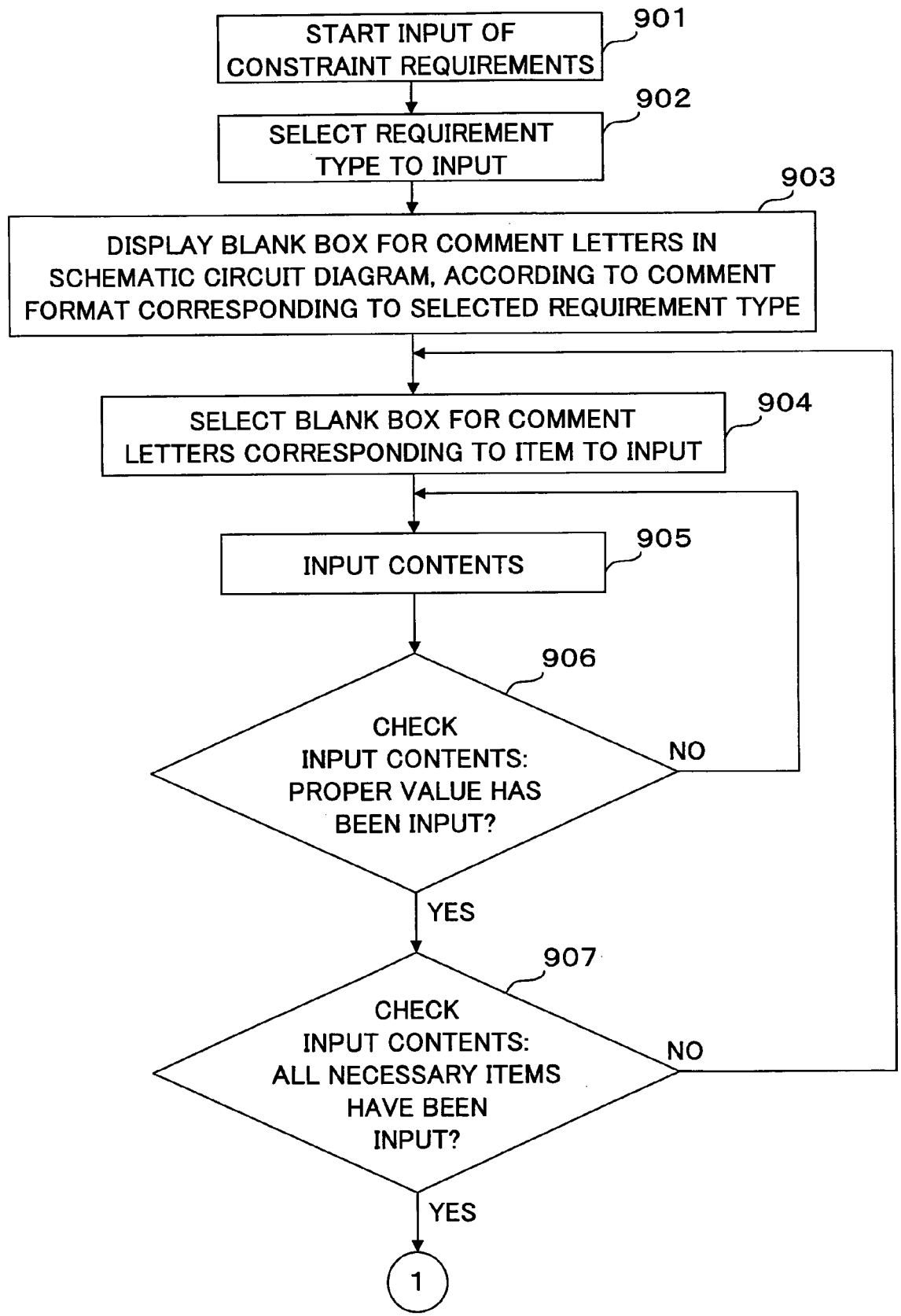

FIG. 12 shows a processing flow chart of operation of the control data 52 of the design constraint requirements being input to the circuit data 50 as a result of the circuit designer inputting the comment letters of the design constraint requirements into the schematic circuit diagram displayed, as described above.

Figure 15:
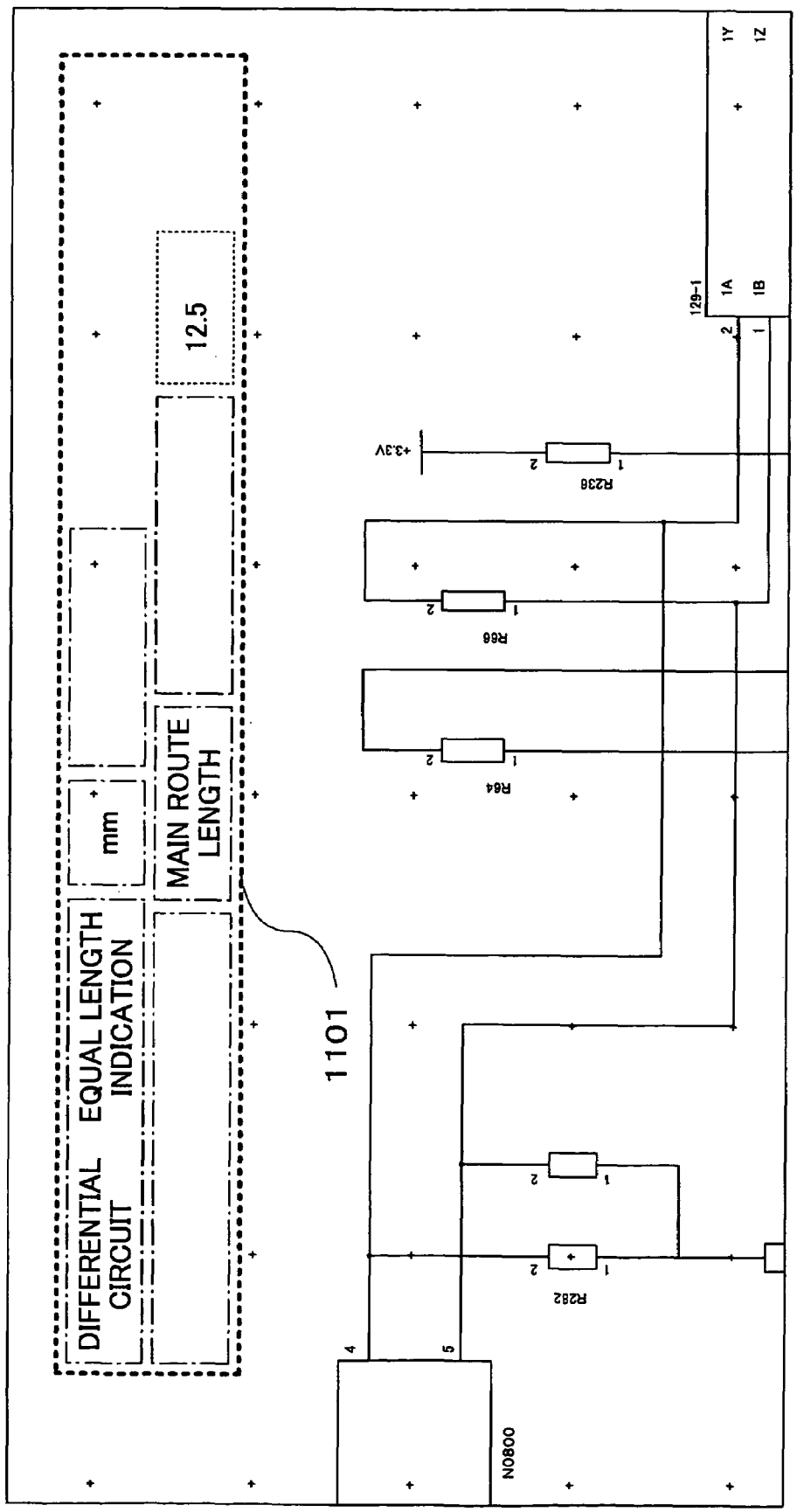
FIG. 15 shows another display example illustrating a procedure of inputting display data of design constraint requirements in an schematic circuit diagram shown on the circuit design CAD in the embodiment of the present invention.

In FIG. 12, in Step 901, the circuit designer gives instructions to the circuit design CAD 1 for starting input of design constraint requirements. In Step 902, the circuit designer selects a type of design constraint requirements to input, by means of the operation input part 10 of the circuit design CAD 1. In Step 903, thanks to the functions of the data converting part 40, a blank box, for inputting comment letters of a comment format according to the requirement type selected in Step 902, is displayed in a schematic circuit diagram displayed on the display part 30. FIG. 15 shows an example of a display of the blank boxes 1110 for comment letters, in the schematic circuit diagram displayed.

In Step 904, the circuit designer selects a blank box to input, from among the blank boxes displayed in the schematic circuit diagram in Step 903. In Step 905, the circuit designer carries out actually inputting contents to the blank box thus selected by means of the operation input part 10. In Step 906, the data converting part 40 checks as to whether or not improper contents have been input to the blank box. When it is determined that improper contents have been input as a result of the check of Step 906, the data converting part 40 returns the current processing, to Step 905.

When the set contents are proper, the data converting part 40 proceeds with the current processing, to Step 907. In Step 907, the data converting part 40 checks whether or not all the required items have been input for the blank boxes displayed in the schematic circuit diagram in Step 903. If there remain setting items not yet filled with, the data converting part 40 returns the current processing, to Step 904.

When all the required items have been set, the data converting part 40 finishes the input processing in Step 908, and fixes the contents. Next, in Step 909, the data converting part 40 generates comment-letters as display data 20 to be actually displayed on the display part 30, from the contents thus input to the blank boxes and fixed in Step 908.

In Step 910, the data converting part 40 places the display data 20 of the comment letters thus generated in Step 909. Simultaneously, in Step 911, the data converting part 40 carries out processing to convert the contents thus input to the blank boxes and fixed, into control data 52 of design constraint requirements.

Then in Step 912, the data converting part 40 automatically sets, to the circuit data 50, the control data 52 of the design constraint requirements thus converted in Step 911. Then, in Step 913, the current processing is finished.

FIG. 14 shows a check list used in Step 906 of FIG. 12, for checking as to whether or not the input contents are proper. According to the contents of the check list, the data converting part 40 carries out the check on the items set by the circuit designer.

FIG. 15 shows a state in which, the blank boxes 1101 for comment letters of design constraint requirements are displayed in the schematic circuit diagram displayed on the display part 30.

Among these boxes 1101, a thin broken line frame (in which, currently, a numerical value of '12.5' is set) is actually displayed in a color of red, which indicates that the frame is currently being input. The circuit designer keys in a specific numerical value in the red frame.

FIG. 15 shows the state in which the numerical value has been already set, while frames in which input has not been made remain, and the circuit designer inputs necessary contents there. The data converting part 40 automatically converts the thus-input contents into control data 52 of design constraint requirements, as mentioned above.

Figure 16:
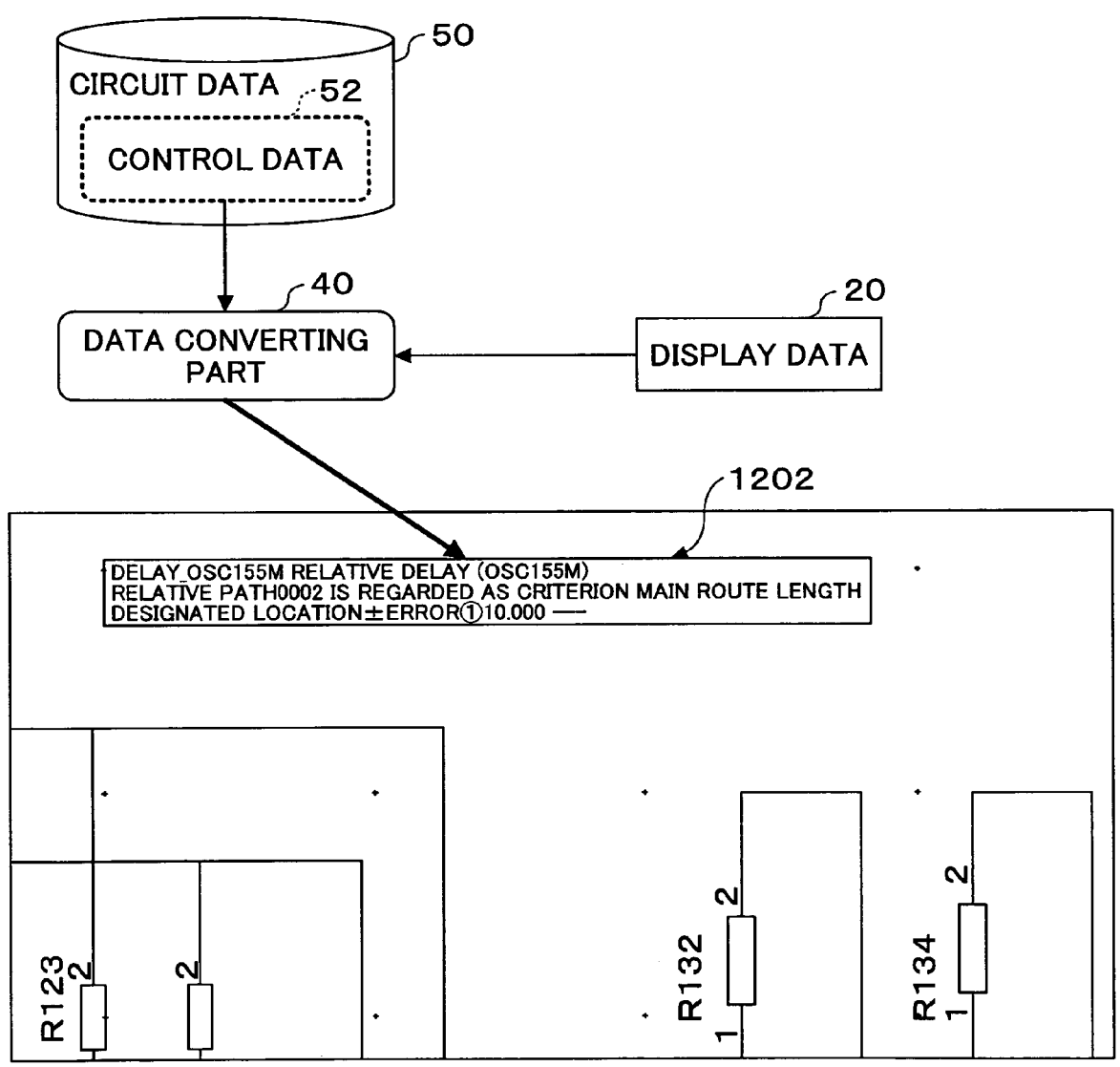
FIG. 16 illustrates operation of automatically generating, from control data of existing design constraint requirements, display data of the same contents, in the circuit design CAD in the embodiment of the present invention.

FIG. 16 shows a state in which, from control data 52 previously set in circuit data 50, display data 20 in the form of comments or such is automatically generated by means of the data converting part 40, and is placed in a schematic circuit diagram displayed on the displayed part 30. The data converting part 40 generates comment letters according to the contents of the control data 52.

At this time, when the circuit designer makes operation to select control data 52 of design constraint requirements to place in the schematic circuit diagram displayed on the display part 30 as comment letters, the data converting part 40 generates corresponding comment letters (i.e., display data 20) from the thus-selected control data 52 according to the thus-given operation. The circuit designer makes operation to place the thus-generated comment letters by clicking a target position to place the comment letters in the schematic circuit diagram.

Figure 17:
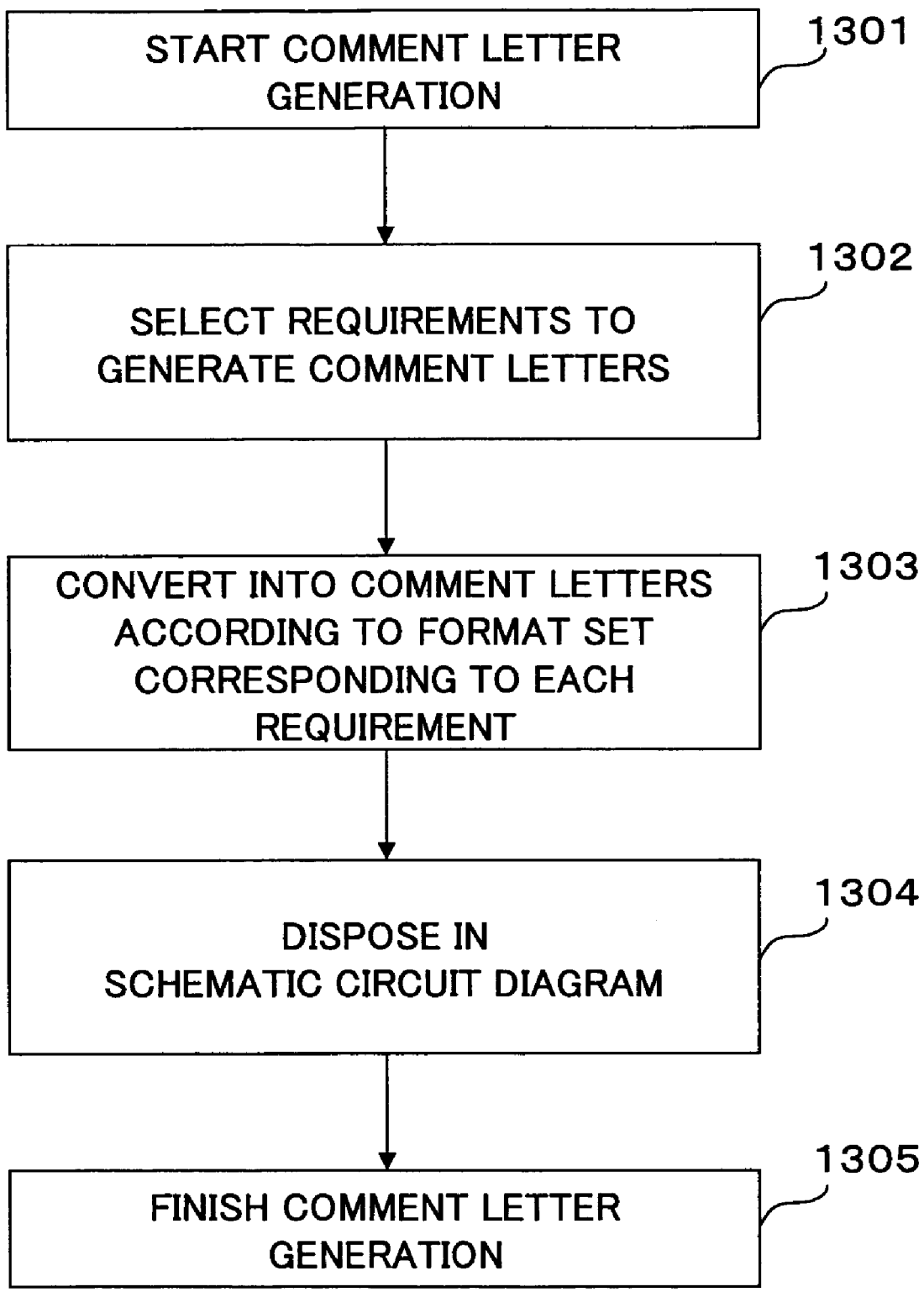
FIG. 17 shows an operation flow chart for operation of automatically generating, from control data of existing design constraint requirements, display data of the same contents, in the circuit design CAD in the embodiment of the present invention.

FIG. 17 shows a processing flow chart when, from the existing control data 52 of design constraint requirements, the comment letters (display data 20) are automatically generated, and are placed in the schematic circuit diagram displayed.

In Step 1301, the circuit designer carries out operation to start generation of the comment letters (display data 20) from the control data 52 of design constraint requirements. In Step 1302, the circuit designer selects an existing requirement from which the comment letters are generated. In Step 1303, the data converting part 40 generates the comment letters according to a comment letter format according to the type of the requirement selected in Step 1302. In Step 1304, the data converting part 40 places the thus-generated comment letters to the schematic circuit diagram displayed on the display part 30. In Step 1305, the comment letter generation process is finished.

In the embodiment of the present invention, a configuration may be provided such that, when the display data 20 of the design constraint requirements in the form of comments or such is placed in the schematic circuit diagram displayed on the screen of the display part 30, the data converting part 40 stores the display data 20 with a provision of a linkage with data (EDIF data or such) of the schematic circuit diagram itself. As a result, when the same schematic circuit diagram is again displayed on the screen at the next time, the corresponding display data is automatically displayed together. Thereby, operation to convert the control data 52 into the display data 20 for each time can be eliminated.

Figure 18:
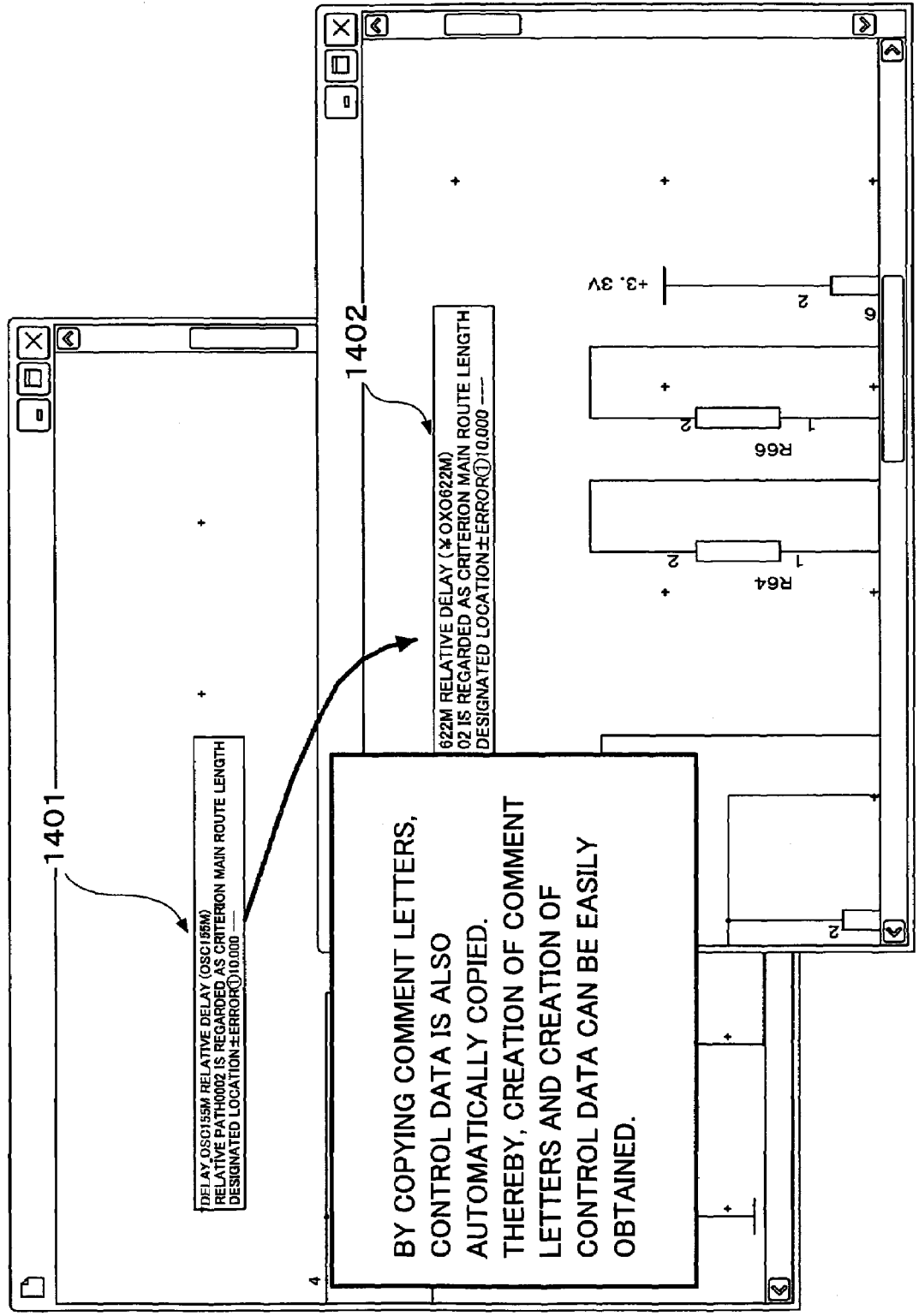
FIGS. 18 and 19 illustrate a function of copying control data of existing design constraint requirements, in the circuit design CAD in the embodiment of the present invention.

FIG. 18 illustrates operation that, thanks to the functions of the data converting part 40, when the circuit designer makes operation to copy comment letters (display data 20), control data 52 of design constraint requirements is automatically copied correspondingly. By this function, the same design constraint requirements can be set to a similar circuit easily. Since the comment letters are generated at the same time, man hours of the circuit designer can be effectively reduced.

FIG. 18 shows a state in which, on the screen of the display part 30, a schematic circuit diagram of an electronic circuit in a first design, and another schematic circuit diagram of an electronic circuit in a second design, are displayed together in a condition in which they overlap each other.

In this state, the circuit designer makes operation, by means of the operation input part 10, to copy the comment letters 1401, to the schematic circuit diagram concerting the second design also displayed on the display part 30. It is noted that, the above-mentioned comment letters 1401 have been previously placed in the schematic circuit diagram of the first design displayed on the display part 30, and has a linkage to corresponding control data 52 of design constraint requirements. This copying operation is made in a well-known cut and paste manner, for example. As a result, the data converting part 40 carries out copying of the corresponding comment letters 1401, and placing the copy 1402 thereof, to the schematic circuit diagram of the second design.

Figure 19:
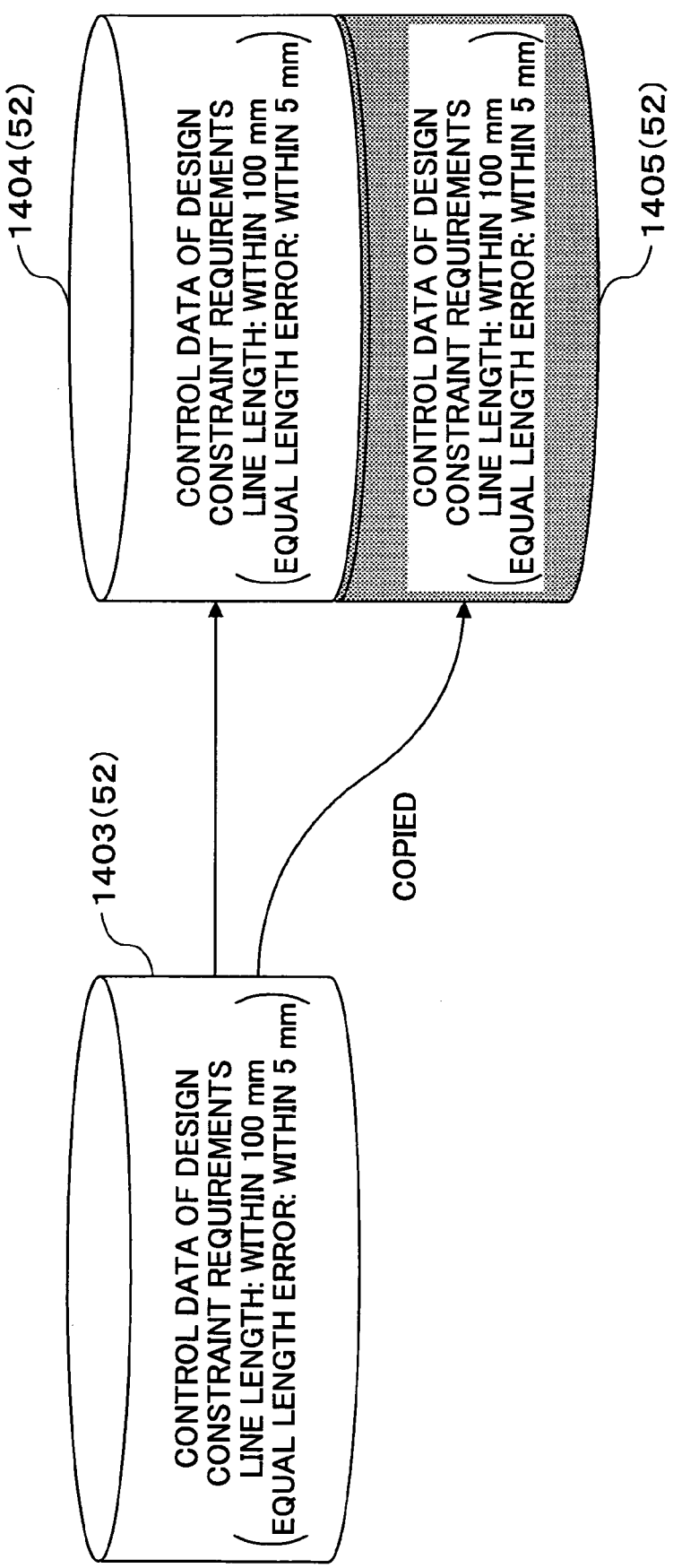

As a result, as shown in FIG. 19, the control data 1403 (52) of design constraint requirements having the linkage from the comment letters 1401 as mentioned above for the circuit data 50 of the first design, is also automatically copied correspondingly, thanks to the functions of the data converting part 40. That is, the original control data 1403 (52) of design constraint requirements is kept as it is, as that 1404 (52) in the circuit data of the first design, while, in the circuit data of the second design, the thus-generated copy, i.e., the control data 1405 (52) of design constraint requirements, is also set automatically.

Thus, according to the embodiment of the present invention, automatic conversion from comment letters or such, i.e., display data 20, given to a schematic circuit diagram which is displayed, into corresponding control data 52 of design constraint requirements. Thus, man hours required for separately creating the control data 52 of design constraint requirements can be eliminated.

Further, it is also possible to convert, from existing control data 52 of design constraint requirements, into comment letters or such, i.e., display data 20 of design constraint requirement. Accordingly, man hours required for separately creating (manually inputting) the comment letters or such, can be eliminated.

Further, by providing a linkage between display data 20 in the form of comments or such and corresponding control data 52 of design constraint requirements, it is possible that, when carrying out operation to copy the comment letters of design constraint requirements, the control data 52 of design constraint requirements is automatically copied at the same time, or, when carrying out operation to edit the comment letters of design constraint requirements, the control data 52 of design constraint requirements is automatically edited at the same time correspondingly. As a result, man hours required for separately inputting or editing the same control data 52 of design constraint requirements for a similar circuit repetitively can be eliminated.

The above-described embodiment of the present invention is one for the circuit design CAD. However, an embodiment of the present invention is not limited thereto, and the present invention may be applied to other design fields. That is, for example, the present invention may be applied to a design CAD for aiding creation of design data of machine construction design, building construction design, or such.

The present invention is not limited to the above-described embodiments, and variations and modifications may be made without departing from the basic concept of the present invention claimed below.

The present application is based on Japanese Priority Application No. 2006-177264, filed on Jun. 27, 2006, the entire contents of which are hereby incorporated herein by reference.

What is claimed is:

1. A design data creating method, for creating design data to which predetermined design constraint requirements are added, comprising:
   converting input design constraint requirements into display data for displaying in a design drawing displayed on a display device;
   converting input design constraint requirements into control data that is configured to control a data flow processed by a computer aided packaging design apparatus; and
   outputting, to the computer aided packaging design apparatus, the design data and the control data.

2. The design data creating method as claimed in claim 1, further comprising:
   displaying, on the display device, a format for a user to input the design constraint requirements.

3. The design date creating method as claimed in claim 1, further comprising:
   changing display contents of the design constraint requirements displayed in a design drawing displayed on the display device; and
   reflecting the change in the display contents of the design constraint requirements, carded out in said changing of the display contents, on the corresponding control data of the design constraint requirements.

4. The design data creating method as claimed in claim 1, further comprising:
   copying the display data of the design constraint requirements displayed in the design drawing displayed on the display device; and
   responding to the copying of the display data of the design constraint requirements carded out in said copying of the display data, to copy the corresponding control data of the design constraint requirements.

5. The design data creating method as claimed in claim 1, further comprising:
   converting the control data of the design constraint requirements into the corresponding display data of the design constraint requirements, and displaying the same in the design drawing displayed on the display device.

6. A design data creating apparatus, for creating design data to which predetermined design constraint requirements are added, comprising:
   a display data converting part configured to convert input design constraint requirements into display data for displaying in a design drawing displayed on a display device; and
   a control data converting part configured to convert input design constraint requirements into control data that is configured to control a data flow processed by a computer aided packaging design apparatus, wherein:
   the design data creating apparatus outputs, to the computer aided packaging design apparatus, the design data and the control data obtained from said control data converting part.

7. The design data creating apparatus as claimed in claim 6, further comprising:
   a part configured to display, on the display device, a format for a user to input the design constraint requirements.

8. The design data creating apparatus as claimed in claim 6, further comprising:
   a display data changing part configured to change display contents of the design constraint requirements displayed in a design drawing displayed on the display device; and
   a control data reflecting part configured to reflect the change in the display contents of the design constraint requirements, carried out by said display data changing part, on the corresponding control data of the design constraint requirements.

9. The design data creating apparatus as claimed in claim 6, further comprising:
   a display data copying part configured to copy the display data of the design constraint requirements displayed in the design drawing displayed on the display device; and
   a control data copying part configured to respond to the copying of the display data of the design constraint requirements carried out by said display data copying part, to copy the corresponding control data of the design constraint requirements.

10. The design data creating apparatus as claimed in claim 6, further comprising:
    a part configured to automatically convert the control data of the design constraint requirements into the corresponding display data of the design constraint requirements, and display the same in the design drawing displayed on the display device.

11. A computer readable information recording medium storing a program for creating design data to which predetermined design constraint requirements are added, said program having instructions for causing a computer to execute for:
    converting input design constraint requirements into display data for displaying in a design drawing displayed on a display device;
    converting input design constraint requirements into control data that is configured to control a data flow processed by a computer aided packaging design apparatus of; and
    outputting, to the computer aided packaging design apparatus, the design data and the control data 12. The computer readable information recording medium as claimed in claim 11, said program further comprising instructions for causing the computer to execute for:
    displaying, on the display device, a format for a user to input the design constraint requirements.

13. The computer readable information recording medium as claimed in claim 11, said program further comprising instructions for causing the computer to execute for:
    changing display contents of the design constraint requirements displayed in a design drawing displayed on the display device; and
    reflecting the change in the display contents of the design constraint requirements, carded out in said changing of the display contents, on the corresponding control data of the design constraint requirements.

14. The computer readable information recording medium as claimed in claim 11, said program further comprising instructions for causing the computer to execute for:
    copying the display data of the design constraint requirements displayed in the design drawing displayed on the display device; and responding to the copying of the display data of the design constraint requirements carded out in said copying of the display data, to copy the corresponding control data of the design constraint requirements.

15. The computer readable information recording medium as claimed in claim 11, said program further comprising instructions for causing the computer to execute for:

automatically converting the control data of the design constraint requirements into the corresponding display data of the design constraint requirements, and displaying the same in the design drawing displayed on the display device.

* * * * *